US010056659B2

(12) United States Patent
Ramasamy

(10) Patent No.: US 10,056,659 B2
(45) Date of Patent: Aug. 21, 2018

(54) PHOTOSYNTHETIC ELECTROCHEMICAL CELLS

(71) Applicant: University of Georgia Research Foundation, Inc., Athens, GA (US)

(72) Inventor: Ramaraja P. Ramasamy, Watkinsville, GA (US)

(73) Assignee: University of Georgia Research Foundation, Inc., Athens, GA (US)

( * ) Notice: Subject to any disclaimer, the term of this patent is extended or adjusted under 35 U.S.C. 154(b) by 0 days.

(21) Appl. No.: 15/257,091

(22) Filed: Sep. 6, 2016

(65) Prior Publication Data

US 2016/0380321 A1 Dec. 29, 2016

Related U.S. Application Data

(62) Division of application No. 13/957,494, filed on Aug. 2, 2013.

(60) Provisional application No. 61/679,118, filed on Aug. 3, 2012.

(51) Int. Cl.
| | | |
|---|---|---|
| H01M 14/00 | (2006.01) | |
| H01L 51/00 | (2006.01) | |
| H01G 9/20 | (2006.01) | |
| B82Y 10/00 | (2011.01) | |
| H01M 8/16 | (2006.01) | |

(52) U.S. Cl.
CPC ........... *H01M 14/005* (2013.01); *B82Y 10/00* (2013.01); *H01G 9/2059* (2013.01); *H01L 51/0093* (2013.01); *H01M 8/16* (2013.01); *H01L 51/0048* (2013.01); *Y02E 10/542* (2013.01)

(58) Field of Classification Search
CPC .............................. H01M 14/005; H01M 8/16
See application file for complete search history.

(56) References Cited

FOREIGN PATENT DOCUMENTS

WO WO2010132633 * 11/2010

OTHER PUBLICATIONS

Moore, Thomas A.; Gust, Devens; Moore, Ana L.; The Function of Carotenoid Pigments in Photosynthesis and Their Possible Involvement in the Evolution of Higher Plants; Carotenoids: Chemistry and Biology; Edited by N.I. Krinsky et al.; Plenum Press, New York, 1990, 223-228.*
Baymann, Frauke; Rappaport, Fabrice; Joliot, Pierre; Kailas, Toivo; Rapid Electron Transfer to Photosystem I and Unusual Spectral Features of Cytochrome c6 in *Synechococcus* sp. PCC7002 in Vivo; Biochemistry 2001, 40, 10570-10577.*
R. E. Blankenship, Molecular Mechanisms of Photosynthesis, Blackwell Science, Oxford, U.K., 2002.
N. S. Lewis, Artificial Photosythesis. American Scientist, 1995, 83, 534-541.
L. Sun, L. Hammarstrom, B. Akermark and S. Styring, Towards artificial photosynthesis: ruthenium-manganese chemistry for energy production. Chem. Soc. Rev., 2001, 30.

(Continued)

*Primary Examiner* — Ula C Ruddock
*Assistant Examiner* — Thomas H. Parsons
(74) *Attorney, Agent, or Firm* — Thomas | Horstemeyer, LLP

(57) ABSTRACT

The present disclosure provides photosynthetic electrochemical cells including photosynthetic compounds and methods of generating an electrical current using the photosynthetic electrochemical cells.

14 Claims, 28 Drawing Sheets

(56) References Cited

OTHER PUBLICATIONS

T. J. Meyer, Chemical Approaches to Artificial Photosynthesis. Am Chem. Res., 1989, 22, 163-170.
I. J. Iwuchulcwu, et al. Self-organized photosynthetic nanoparticle for cell-free hydrogen production. Nat Nano, 2010, 5, 73-79.
I. Esper et al. Photosynthesis as a power supply for (bio-)hydrogen productionTrends in plant science, 2006, 11, 543-549.
M. R. Wasielewski, Photoinduced Electron Transfer in Supramolecular Systems for Artificial Photosynthesis. Chem. Rev., 1992, 92, 435-461.
M. R. Wasielewski, Self-Assembly Strategies for Integrating Light Harvesting and Charge Separation in Artificial Photosynthetic Systems. Acc. of Chem. Res., 2009, 42, 1910-1921.
I. Rybtchinski, et al. Combining Light-Harvesting and Charge Separation in a Self-Assembled Artificial Photosynthetic System Based on Perylenediimide Chromophores J. Am. Chem. Soc., 2004, 126, 12268-12269.
A. J. Bard and M. A. Fox, Artificial Photosynthesis: Solar Splitting of Water to Hydrogen and Oxygen Acc. of Chem. Res., 1995, 28, 141-145.
R. L. Pan, et al. A Photosynthetic Photolectrochemical Cell using Flavin Mononucleotide as the Electron Acceptor. Photochem. and Photobiol., 1982, 35, 655-664.
I. Sanderson, et al. Studies of a Photosynthetic Photoelectrochemical Cell Using Various Electrodes. App. Biochem. Biotech., 1983, 8, 395-405.
K. B. Lam, et al. A MEMS Photosynthetic Electrochemical Cell Powered by Subcellular Plant Photosystems J Microelectromech. S, 2006, 15, 1243-1250.
M. Okano, et al. Water Photolysis by a Photoelectrochemical Cell Using an Immobilized Chloroplasts-Methyl Viologen System. Agricultural and Biol. Chem., 1984, 48, 1977-1983.
R. Carpentier and M. Mimeault, The Photosynthetic Partial Reactions involved in Photoelectrochemical Current Generation by Thylakoid Membranes. Biotech. Lett., 1987, 9, 111-116.
S. Lemieux and R. Carpentier, Properties of a Photosystem II Preparation in a Photoelectrochemical Cell J. Photochem. and Photobiol. B: Biol., 1988, 2, 221-231.
I. Y. Katz, et al. Electrochemical approach to the development of a photoelectrode on the basis of photosynthetic reaction centers. J. Electroanal. Chem. and Interfacial Electrochem., 1990, 298, 239-247.
K. Abe, et al. Photoactivity Characteristics of a Biodevice Using Primary Photosynthetic Reaction Centers. Electroanal., 2005, 17, 2266-2272.
A. Badura, et al. Photo-Induced Electron Transfer Between Photosystem 2 via Cross-linked Redox Hydrogels Electroanal., 2008, 20, 1043-1047.
R. Das, et al. Integration of Photosynthetic Protein Molecular Complexes in Solid-State Electronic Devices. Nano Lett., 2004, 4, 1079-1083.
Vittadello et al. Photoelectron Generation by Photosystem II Core Complexes Tethered to Gold Surfaces. ChemSusChem, 2010, 3, 471-475.
N. Lebedev, et al. Conductive Wiring of Immobilized Photosynthetic Reaction Center to Electrode by Cytochrome c. J. Am. Chem. Soc., 2006, 128, 12044-12045.
R. Carpentier, Photosynthesis Research Protocols, Humana Press, Totowa, N.J, 2004.
R. P. Ramasamy, et al. High electrocatalytic activity of tethered multicopper oxidase-carbon nanotube conjugates. Chem. Comm., 2010, 46, 6045-6047.
N. S. Parimi, et al. Kinetic and Mechanistic Parameters of Laccase Catalyzed Direct Electrochemical Oxygen Reduction Reaction ACS Cat., 2012, 2, 38-44.
C. Lau, et al. Design of Carbon Nanotube-Based Gas-Diffusion Cathode for O2 Reduction by Multicopper Oxidases Adv. Energy Mat., 2012, 2, 162-168.
I. A. Semenova, The thylakoid membrane in a wide pH range. J. Plant Physiol., 2002, 159, 613-625.
P. N. Bartlett, Bioelectrochemistry Fundamentals, Experimental Techniques and Applications, John Wiley & Sons, Ltd, UK, 2008.
M. Richard and J. A. Pedro, Identification of a g = 1.90 High-Potential Iron-Sulfur Protein. Biochem. Bioph. Res. Co., 1975, 63, 1157-1160.
D. G. Sanderson, L. B. Anderson and E. L. Gross, Determination of the redox potential and diffusion coefficient of the protein plastocyanin using optically transparent filar electrodes. Biochim. Biophys. Acta, 1986, 852, 269-278.
Y. Abdollahi, et al. Photocatalytic Degradation of 1,4-Benzoquinone in Aqueous ZnO Dispersions. Brazilian Chem. Soc., 2012, 23, 236-240.
V. Ivanov and S. Lyashkevich, Photolysis of p-Benzoquinone and p-Chloranil in Aqueous Sodium Sulfite Solution. High Energy Chem., 2011, 45, 210-213.
O. Yehezkeli, et al. Integrated photosystem II-based photo-bioelectrochemical cells. Nat. Comm., 2012, 3, 742.
A. Badura, et al. Light-Driven Water Splitting for (Bio-)Hydrogen Production: Photosystem 2 as the Central Part of a Bioelectrochemical DevicePhotochemical. and Photobiol., 2006, 82, 1385-1390.
L. N. M. Duysens, 3-(3,4-Dichlorophenyl)-1,1-Dimethylurea (DCMU) Inhibition of System II and Light-Induced Regulatory Changes in Energy Transfer EfficiencyBiophys. J., 1972, 12, 858-863.
Bhardway, R., Pan, R.L., and Gross, E.L. Photosynthesis. vol. VI. Photosynthesis and productivity. Photosynthesis and environment. Proceedings of the Fifth International Congress on Photosynthesis. Sep. 7-13, 1980, Halkidiki, Greece [Akoyunoglou, G. (editor)]; Philadelphia, Pennsylvania: Balaban International Science Services, 1981, 119-728.
Carmeli, Itai; Mangold, Markus, Frolov, Ludmila, Zebli, Bernd; Carmeli, Chanoch; Richter, Shachar; Holleitner, Alexander W.; A. Photsynthetic Reaction Center Covalently Bound to Carbon Nanotubes, Ads. Mater. 2007, 19, 3901-3905.
Lebedev, Nikolai; Trammell, Scott A.; Tsai, Stanislav; Spano, Anthony; Kim, Jin Ho; Xu, Jimmy; Twigg, Mark E., Schnur, Joel M.; Langmuir 2008, 24, 8871-8876.
Rasmussen M and Minteer SD. Photobioelectrochemistry: Solar Energy Conversion and Biofuel Production with Photosynthetic Catalysts. Journal of the Electrochemical Society, 161 (10) H647-H655 (2014).
Sekar N et al. Photocurrent generation by immobilized cyanobacteria via direct electron transport in photo-bioelectrochemical cells. Phys.Chem.Chem.Phys., 2014, 16, 7862.

\* cited by examiner

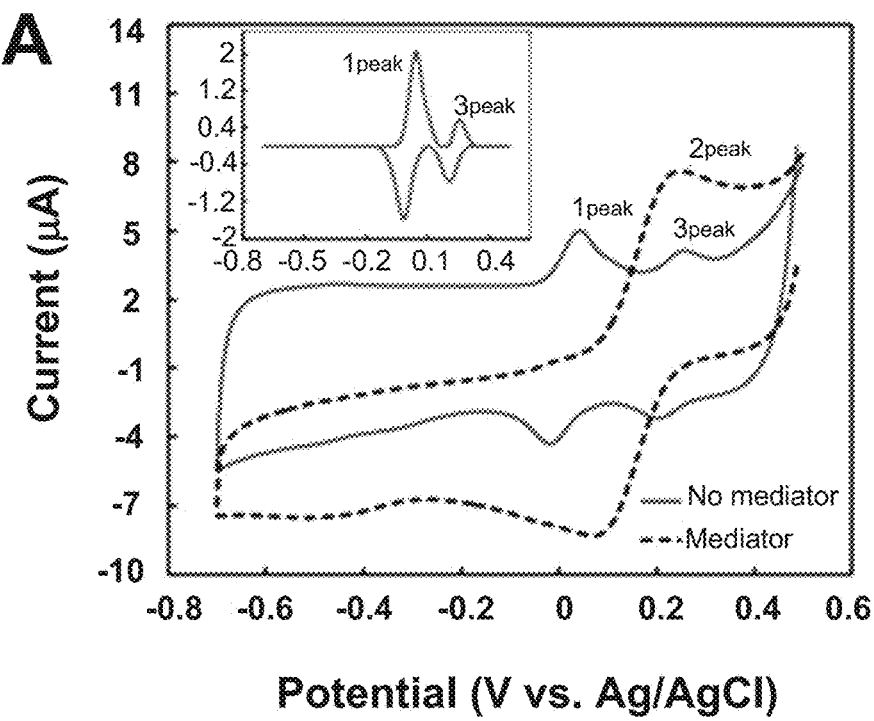
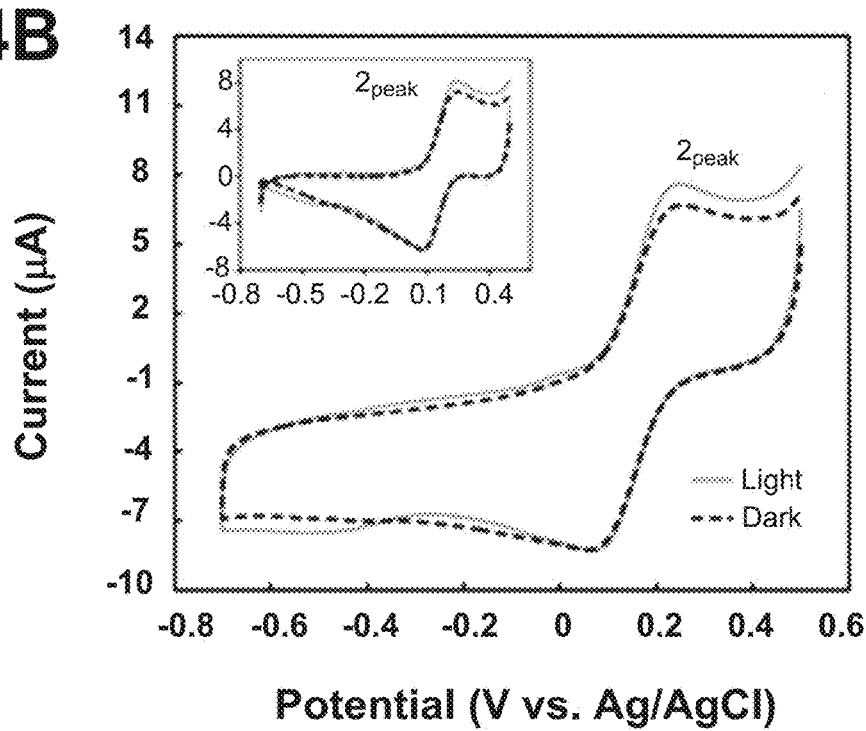

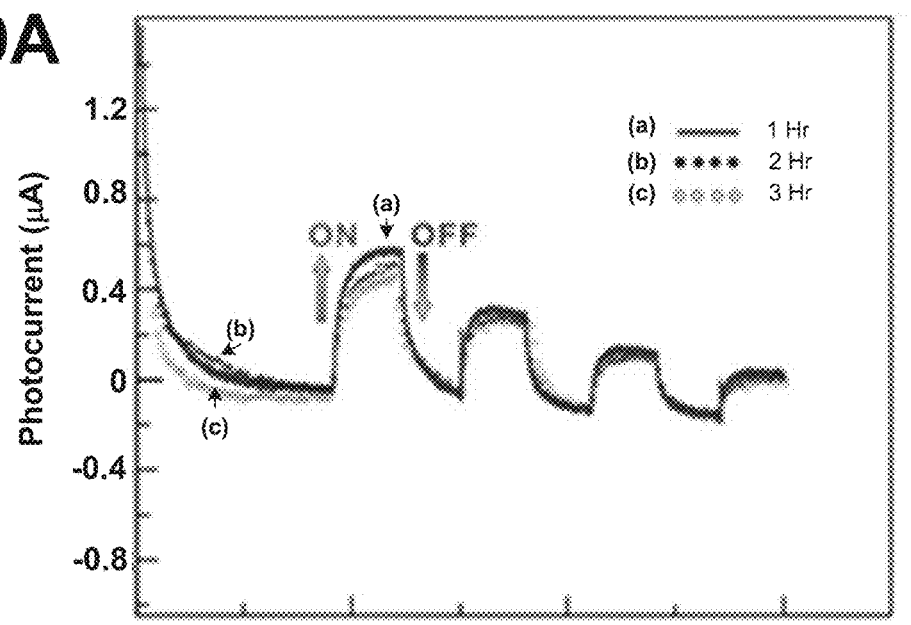
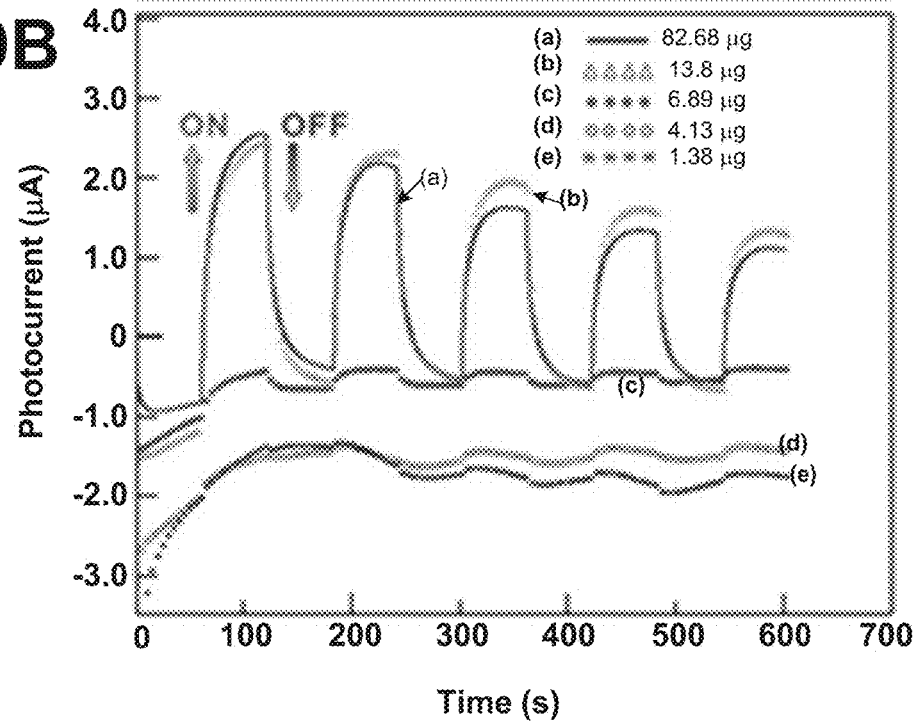

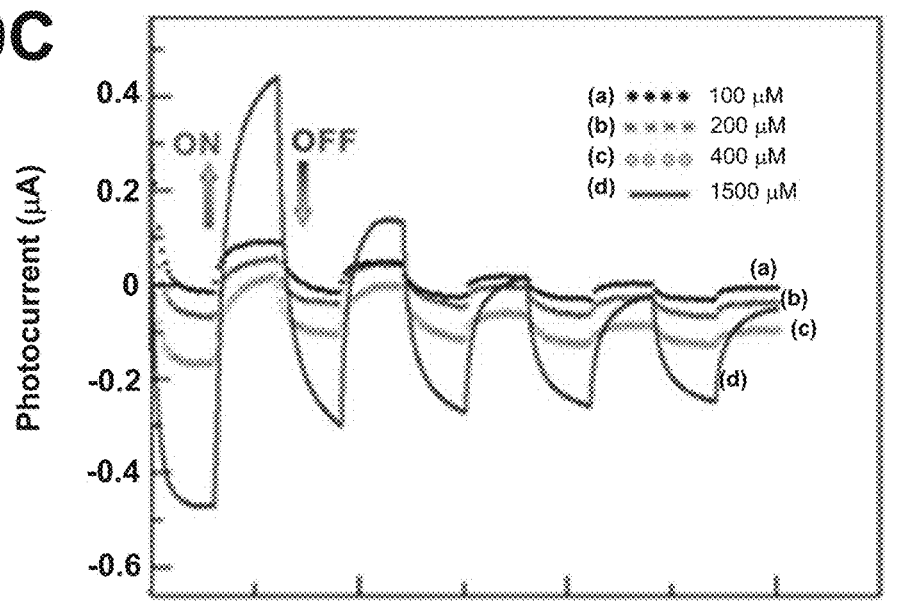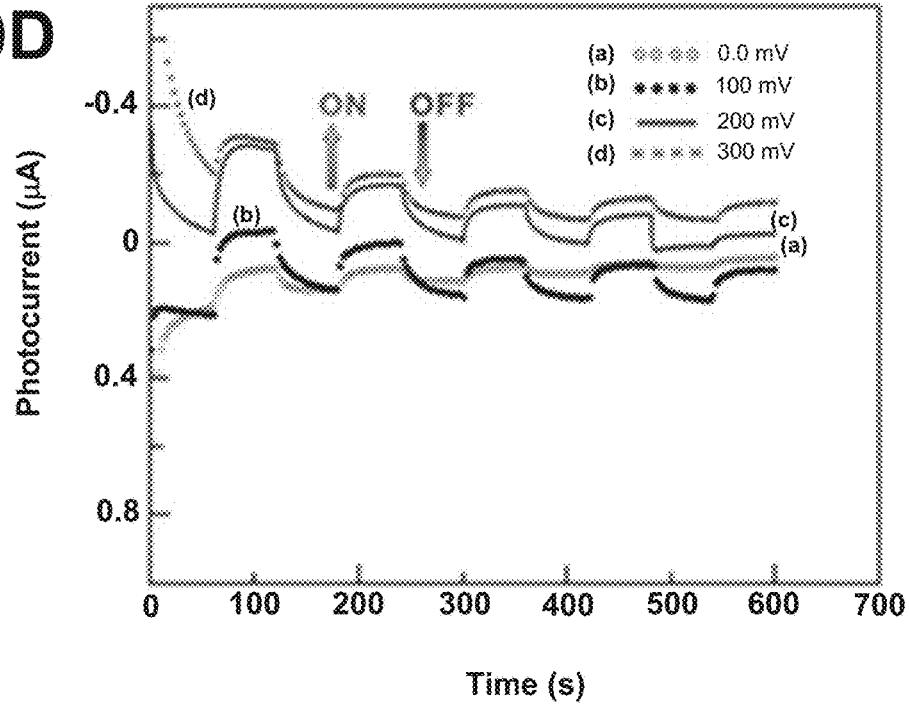

PHOTOSYNTHETIC ELECTROCHEMICAL CELLS

CROSS-REFERENCE TO RELATED APPLICATION

This application is a Divisional of co-pending US application having Ser. No. 13/957,494, filed on Aug. 2, 2013. This application also claims priority to U.S. provisional application entitled "Photosynthetic Electrochemical Cells", having Ser. No. 61/679,118 filed on Aug. 3, 2012, which is entirely incorporated herein by reference.

BACKGROUND

Plant photosynthesis provides an unmatched quantum efficiency of nearly 100%. In recent years, significant interest has evolved in mimicking and/or harnessing the photosynthetic process for energy conversion and hydrogen generation applications. Multiple approaches to artificial photosynthesis exist, including light energy harvesting using natural pigments from plants and microorganisms and using whole cell microorganisms. Scientists have explored photosynthetic organelles such as thylakoids, chlorophyll molecules, photosystems, and oxygen evolving complexes for photo-electrochemical activity. However, the challenge of establishing electrical communication between photosynthetic reaction centers and the electrode has proven extremely difficult. Thus, to date, a photosynthetic electrochemical cell that allows direct electron transfer between the photosynthetic centers and an electrode has remained elusive.

SUMMARY

Briefly described, embodiments of the present disclosure provide for photosynthetic electrochemical cells and methods of using the photosynthetic electrochemical cells to produce an electrical current.

In embodiments, photosynthetic electrochemical cells of the present disclosure include an anode composite having an anode, a photosynthetic reaction center (PSRC) including at least one photosynthetic compound, and a nanostructured material in electrochemical communication with the PSRC, and a cathode composite having a cathode and at least one enzyme or metallic catalyst capable of reducing $O_2$. The PSRC is capable of oxidizing water molecules and generating electrons using a light induced photo-electrochemical reaction, and the electrons generated by the PSRC are transferred to the anode via direct electron transfer. In embodiments, the photosynthetic compounds can include, but are not limited to, PSII, PSI, plastoquinone, cyt $b_6f$, plastocyanin, phycocyanin, phycoerythrin, carotenoids, and combinations of these compounds. In embodiments, the nanostructured material is a matrix of nanostructured materials which can be made from materials such as, but not limited to, carbon nanotubes, multi-walled carbon nanotubes, fullerenes, carbon nanoparticles, graphenes, carbon nanosheets, two-dimensional carbon platelets, other carbon nanostructured materials, metallic nanoparticles, semiconductor nanoparticles, quantum dots, and combinations of these materials.

The present disclosure also includes embodiments of photosynthetic electrochemical cells including an anode composite having an anode in electrochemical communication with a thylakoid membrane, and a cathode composite having a cathode and at least one enzyme or metallic catalyst capable of reducing $O_2$. The thylakoid membrane in such embodiments is capable of oxidizing water molecules and generating electrons using light induced photo-electrochemical reactions, and the anode composite is configured such that electrons generated by the thylakoid membrane are conducted to the anode via direct electron transfer. In some embodiments, the thylakoid membrane is coupled to the anode by a matrix of nanostructured material, such as described above.

Additional embodiments of photosynthetic electrochemical cells of the present disclosure include an anode composite having an anode in electrochemical communication with a photosynthetic organism or a part of a photosynthetic organism, and a cathode composite having a cathode and at least one enzyme or metallic catalyst capable of reducing $O_2$. In such embodiments, the photosynthetic organism or part thereof is capable of oxidizing water molecules and generating electrons using light induced photo-electrochemical reactions, and the anode composite is configured such that the electrons generated by the photosynthetic organism or part thereof are conducted to the anode via direct electron transfer. In some embodiments, the photosynthetic organism or part thereof is coupled to the anode by a matrix of nanostructured material, as described above. In embodiments, the photosynthetic organism can include, but is not limited to, cyanobacteria, green sulfur bacteria, algae, *spirulina, chlorella*, and combinations of such organisms.

The present disclosure also includes methods of generating an electrical current with a photosynthetic electrochemical cell. In embodiments, methods of generating an electrical current include providing an electrochemical cell including an anode composite having photosynthetic reaction centers (PSRC) that include at least one photosynthetic compound and are in electrical communication with an anode via a nanostructured material and a cathode composite capable of reducing $O_2$; and exposing the electrochemical cell to light in the presence of water. In such methods, the PSRCs of the anode composite use light energy to oxidize water molecules and generate electrons, which are transferred to the anode via the nanostructured material, and then reduce $O_2$ at a cathode, thereby inducing a potential difference between the anode and the cathode and generating an electrical current.

Embodiments of methods of generating an electrical current of the present disclosure also include converting light energy to electrical energy using a photosynthetic electrochemical cell of the present disclosure.

Other systems, methods, features, and advantages of the present disclosure will be or become apparent to one with skill in the art upon examination of the following drawings and detailed description. It is intended that all such additional systems, methods, features, and advantages be included within this description, and be within the scope of the present disclosure.

BRIEF DESCRIPTION OF THE DRAWINGS

The disclosure can be better understood with reference to the following drawings, which are discussed in the description and examples below. The components in the drawings are not necessarily to scale, emphasis instead being placed upon clearly illustrating the principles of the present disclosure.

FIGS. 4A-4B are graphs of cyclic voltammograms (CV) of a thylakoid-MWNT composite modified electrode. FIG. 4A illustrates the CV in the presence and absence of 1.5 mM mediator; inset graph shows capacitance subtracted voltammogram. FIG. 4B illustrates the CV under light and dark conditions with 1.5 mM mediator; inset graph shows the background subtracted voltammograms. $1_{peak}$, $2_{peak}$ and $3_{peak}$ represent the redox reactions of cyt b6f, ferricyanide mediator, and plastocyanin, respectively.

In FIGS. 5A and 5B, ↑ and ↓ represent light on and light off conditions, respectively.

FIGS. 9A-D are graphs illustrating photocurrent analysis of thylakoid-MWNT composites for the optimization of (9A) thylakoid immobilization time, (9B) chlorophyll loading, (9C) mediator concentration and (9D) applied potential. ↑ represents light condition and ↓ represents dark condition. An applied potential of 0.2 V, 1 hr thylakoid immobilization time, and 1.5 mM mediator concentration were the most favorable conditions for this technique.

FIG. 15A is a graph of photocurrent response (↑ represents light condition and ↓ represents dark condition), FIG. 15B illustrates cyclic voltammograms under light. Note: 1× corresponds to 0.014 $mg_{chl}$.

FIGS. 24A and 24B are graphs, with FIG. 24A illustrating absorption spectrum of *Nostoc* and *A. variablis* in the visible light spectrum, while FIG. 24B illustrates the measurement of photocurrent of *Nostoc* sp. at different characteristic wavelengths.

DESCRIPTION

Figure 1:
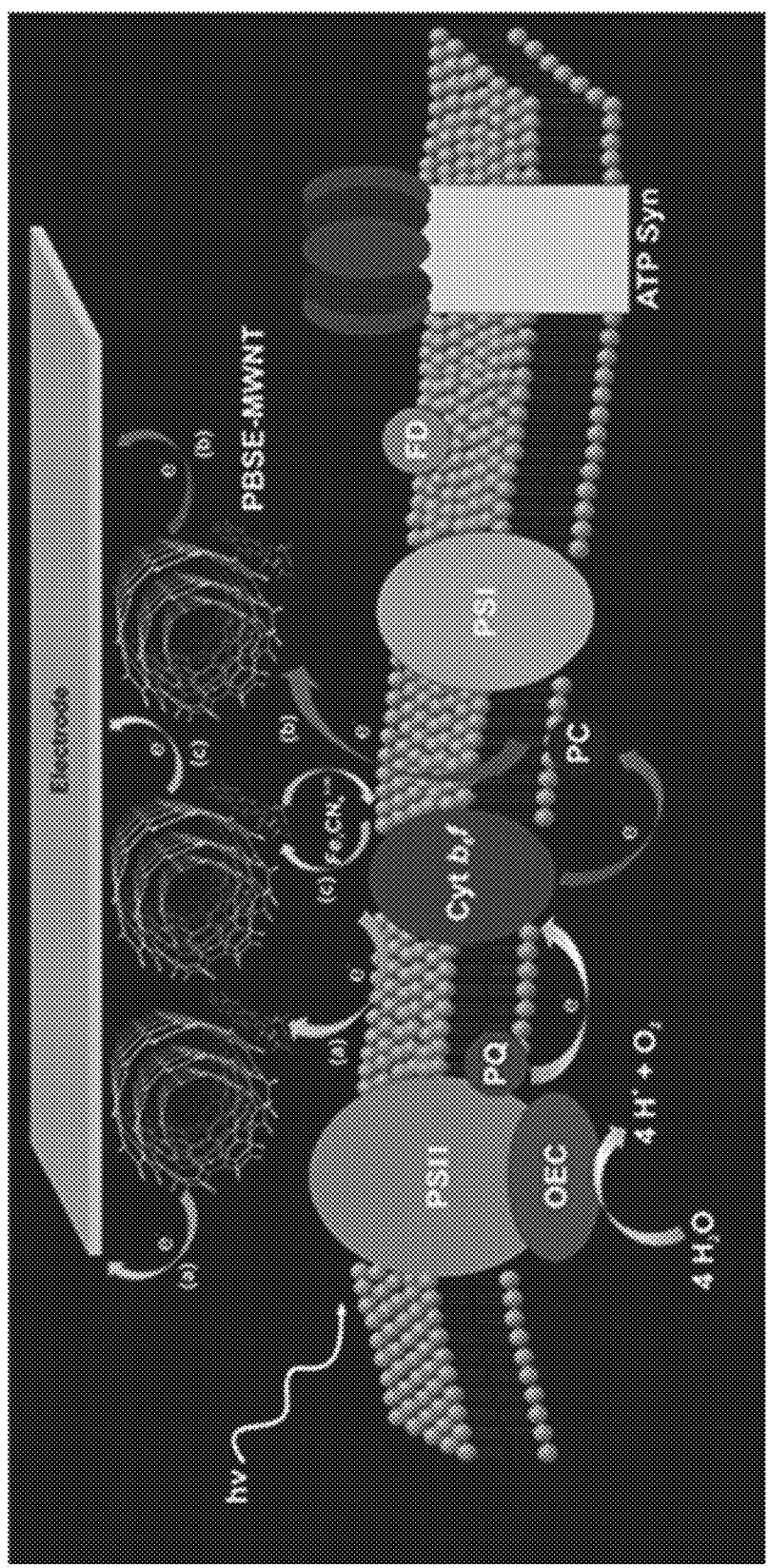
FIG. 1 illustrates a schematic representation of a thylakoid membrane tethered to MWNT modified electrode using PBSE linkers and the likely electron transport pathways [(a), (b) and (c)] between thylakoid membrane proteins and the electrode. OEC, PQ, Cyt, PC, FD, and ATP Syn represent oxygen evolving complex, plastoquinone, cytochrome, plastocyanin, ferredoxin and ATP synthase, respectively. PSI and PSII represent the photosynthetic reaction centers I and II, respectively. Other components of the thylakoid membrane are not shown.

The details of some embodiments of the present disclosure are set forth in the description below. Other features, objects, and advantages of the present disclosure will be apparent to one of skill in the art upon examination of the following description, drawings, examples and claims. It is intended that all such additional systems, methods, features, and advantages be included within this description, be within the scope of the present disclosure, and be protected by the accompanying claims Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of molecular biology, microbiology, organic chemistry, biochemistry, genetics, botany, electrochemistry and the like, which are within the skill of the art. Such techniques are explained fully in the literature.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

As used herein, the following terms have the meanings ascribed to them unless specified otherwise. In this disclosure, "comprises," "comprising," "containing" and "having" and the like can have the meaning ascribed to them in U.S. Patent law and can mean "includes," "including," and the like; "consisting essentially of" or "consists essentially" or the like, when applied to methods and compositions encompassed by the present disclosure refers to compositions like those disclosed herein, but which may contain additional structural groups, composition components or method steps. Such additional structural groups, composition components or method steps, etc., however, do not materially affect the basic and novel characteristic(s) of the compositions or methods, compared to those of the corresponding compositions or methods disclosed herein. "Consisting essentially of" or "consists essentially" or the like, when applied to methods and compositions encompassed by the present disclosure have the meaning ascribed in U.S. Patent law and the term is open-ended, allowing for the presence of more than that which is recited so long as basic or novel characteristics of that which is recited is not changed by the presence of more than that which is recited, but excludes prior art embodiments.

Prior to describing the various embodiments, the following definitions are provided and should be used unless otherwise indicated.

Definitions

In describing and claiming the disclosed subject matter, the following terminology will be used in accordance with the definitions set forth below.

As used herein, the term "photosynthetic compound" includes any compound involved in the photosynthetic process, e.g., the process of harnessing light energy to induce a photochemical reaction to oxidize water molecules and generate electrons. "Photosynthetic compounds" includes "photosynthetic proteins" and protein complexes, such as, but not limited to, PSI, PSII, cyt $b_6f$, plastocyanin, phycocyanin, and phycoerythrin as well as other non-protein, photosynthetic molecules, such as, but not limited to, plastoquinone and carotenoids. The photosynthetic compounds of the present disclosure may be isolated from the host organism and organelles in which they originate, or they may be located in a thylakoid membrane or thylakoid organelle or photosynthetic bacterial organism.

As used herein, the term "photosynthetic reaction center" (PSRC) refers to one or more photosynthetic compounds as defined above. A PSRC may include a single photosynthetic compound (e.g., PSII) or it may contain a group of photosynthetic compounds, whether isolated or working in a cluster or entity (e.g., thylakoid membrane or photosynthetic organism). A PSRC, as used in the present disclosure, has the ability to harness light energy to induce a photochemical reaction to oxidize water molecules and generate electrons.

As used in the present disclosure, two materials are in "electrochemical communication" when electrons generated by a chemical reaction of one material (e.g., photosynthetic reaction centers) can be transferred to and/or accepted by the other material (e.g., nanostructured material and/or electrode).

"Direct electron transfer," as used in the present application indicates that an electron can be transferred to an electrode (e.g., anode) from the photosynthetic reaction center (PSRC) that catalyzed the reaction that produced the electron, as opposed to having to be transferred to the electrode by a separate shuttle molecule (e.g., a redox mediator or redox shuttle). In the present application, direct electron transfer includes the transfer of electrons generated from a photosynthetic protein to the electrode through a nanostructured material or matrix of nanostructured materials, such as where the nanostructured material couples the photosynthetic proteins, thylakoid membrane and/or photosynthetic organism to the electrode. The presence of direct electron transfer in an electrochemical cell of the present disclosure does not preclude the existence of some electron transfer occurring through a mediator, it just indicates that direct electron transfer is occurring in the cell.

As used herein, the term "anode composite" refers to a construct that provides the anode function in a photosynthetic electrochemical cell of the present disclosure. Thus, the anode composite includes the anode as well as any other materials or components coupled to the anode that provide for the oxidizing capability of the anode (e.g., nanostructured matrix material, photosynthetic reaction centers, and the like, as well as compounds or liking agents used to couple the anode to the other components of the anode composite). Similarly, the term "cathode composite" refers to a construct that includes the cathode as well as other materials that provide for the reducing activity of the cathode (e.g., the cathode and a compound capable of reducing $O_2$, as well as any compounds or agents used to couple the cathode to the other components of the cathode composite, such as nanostructured materials and/or any linking agents).

The term "matrix of nanostructured materials", as used in the present disclosure, includes a network or multi-dimensional structure of nanoparticles capable of coupling photosynthetic proteins, a thylakoid membrane or organelle to an electrode.

"Redox mediator" or "redox shuttle" refers to a compound capable of assisting in the transfer of electrons between a redox enzyme (e.g., a photosynthetic compound of the present disclosure that oxidizes water and generates electrons) and an electrode.

Having defined some of the terms herein, the various embodiments of the disclosure will be described.

DESCRIPTION

Embodiments of the present disclosure include photosynthetic electrochemical cells capable of generating an electric current using light induced photo-electrochemical reactions catalyzed by photosynthetic compounds. The present disclosure also includes methods of generating an electrical current using photosynthetic compounds, thylakoid membranes, and/or photosynthetic bacteria or portions of photosynthetic bacteria to harness light energy and using direct electrochemical communication to transfer electrons generated by the photosynthetic proteins to an electrode.

In embodiments of the photosynthetic electrochemical cells of the present disclosure, the cell includes an anode composite that includes an anode (substrate electrode) and a photosynthetic reaction center (catalyst) including one or more photosynthetic compounds. The cell also includes a cathode or cathode composite including a cathode (substrate electrode) and at least one enzyme or metallic catalyst capable of reducing oxygen or other reductant. In embodiments of the present disclosure, the anode composite harnesses light energy to oxidize water molecules and generate electrons for transfer to the cathode for reduction of oxygen. Thus, the cathode uses electrons from the anode to reduce $O_2$, which induces a potential difference between the anode and the cathode and generates an electrical current. The methods and the photosynthetic electrochemical cells of the present disclosure, therefore, provide a method of harnessing light energy to generate an electrical current through photo-induced electrochemical reactions and direct electron transfer.

In embodiments, the anode composite includes a photosynthetic reaction center (PSRC), or multiple PSRCs. The PSRC includes one or more photosynthetic compounds, and such photosynthetic compounds can include proteins, pigments, protein/pigment complexes, and other non-protein compounds involved in photosynthesis. In embodiments of photosynthetic electrochemical cells of the present disclosure, the PSRC of the anode composite includes at least one photosynthetic protein capable of oxidizing water molecules and generating electrons using light induced photo-electrochemical reaction. The electrons produced by the PSRCs are conducted to the anode via direct electron transfer. While not every electron produced by the PSRC will necessarily be conducted to the anode via direct electron transfer (some may be lost, and in some embodiments, a portion of the electrons generated may be transferred to the anode via a redox mediator), it will be understood that at least a portion of the electrons are conducted to the anode via direct electron transfer. In embodiments of the photosynthetic electrochemical cells of the present disclosure, the PSRC includes one or more of the following photosynthetic compounds: PSII, PSI, plastoquinone, cyt $b_6f$, plastocyanin, phycocyanin, phycoerythrin, and carotenoids. The PSRC may include a combination of the above photosynthetic compounds. In embodiments, the PSRC of the electrochemical cell of the present disclosure includes at least one photosynthetic protein or protein complex, such as, but not limited to, PSI, PSII, cyt $b_6f$, plastocyanin, phycocyanin, and phycoerythrin. In embodiments, the PSRC can also include non-protein photosynthetic compounds such as, but not limited to, plastoquinone and carotenoids. In embodiments, the PSRC may include one or more, two or more, three or more, or any combination of the above photosynthetic compounds. In embodiments, the anode composite may include one or more PSRCs where each PSRC may include one or more photosynthetic compounds.

The photosynthetic proteins and compounds included in the photosynthetic electrochemical cells of the present disclosure may be isolated (e.g., removed from their natural environment, organism, organelle, membrane, etc.) or they may be included in a thylakoid membrane, an in-tact thylakoid organelle, a photosynthetic organism (e.g. a photosynthetic bacterium) or a photosynthetic portion of a photosynthetic organism (e.g., a portion of the organism that is capable of photosynthesis when isolated from the source organism).

In embodiments of the photosynthetic electrochemical cells of the present disclosure, the PSRCs are included in a photosynthetic entity coupled to the anode. In some embodiments where the photosynthetic compounds are isolated from their natural environment, they can be included in a synthetic photosynthetic structure (e.g., a structure made of nanostructured materials, such as the matrix of nanostructured materials described in greater detail below). In other embodiments the photosynthetic compounds are present in a natural photosynthetic entity (e.g., a thylakoid organelle, a thylakoid membrane, a photosynthetic organism, or a portion of a photosynthetic organism). Using the proteins in a natural environment, such as a thylakoid membrane or photosynthetic bacterium, may provide certain advantages, such as facilitating the coordinated transfer of electrons between the various photosynthetic compounds in the membrane/organism. This offers various pathways for electron transfer between the photosynthetic compounds in the PSRCs and the anode, rather than just a single path offered by a single isolated photosynthetic protein. Thus, in some embodiments it may be advantageous to utilize natural photosynthetic entities, such as a portion of a thylakoid membrane, an intact thylakoid organelle, or photosynthetic organism, or part thereof in the electrochemical cells of the present disclosure.

As used herein, a PSRC can refer to an isolated photosynthetic compound, to a grouping or cluster of photosynthetic compounds working together, to a synthetic structure including a cluster of photosynthetic compounds, to the photosynthetic compounds or groups of compounds within such a synthetic structure, to a single photosynthetic entity such as a thylakoid membrane, thylakoid organelle or photosynthetic organism, or to a group of photosynthetic compounds within such a photosynthetic entity. Thus, a PSRC refers to any single or grouping of photosynthetic compounds capable of oxidizing water molecules and generating electrons using light induced photo-electrochemical reactions.

The photosynthetic compounds (whether isolated or part of a natural or synthetic photosynthetic structure) are included in the anode composite such that the PSRCs are in electrochemical communication with the anode so that electrons generated during photosynthetic reactions can be conducted directly to the anode. In some embodiments, the PSRCs are coupled to the anode by a nanostructured material. In such embodiments, the anode composite also includes a nanostructured material in electrochemical communication with at least one PSRC and the anode. In embodiments where the PSRCS are isolated photosynthetic compounds or clusters of isolated compounds, the PSRCs may be coupled to and/or integrated into a nanostructured material such that they form a synthetic photosynthetic structure, as described above, and the photosynthetic structure can be coupled directly to the anode. In other embodiments, the PSRCs may be a natural photosynthetic entity, and the PSRC/entity may be coupled to the anode via a matrix of nanostructured material. In some embodiments, the anode can be functionalized with a nanostructured material, and the PSRC is in electrochemical communication with the nanostructured material of the anode.

In embodiments, the nanostructured material is a matrix of nanostructured material made of a material capable of being coupled to and in electrochemical communication with the PSRCs. In embodiments, the nanostructured materials include, but are not limited to, carbon based nanomaterials, metallic nanoparticles, semiconductor nanoparticles, quantum dots or combinations of these materials. Some embodiments of carbon based nanomaterials useful for the electrochemical cells of the present disclosure include, but are not limited to, materials such as carbon nanotubes, multi-walled carbon nanotubes, fullerenes, carbon nanoparticles, graphenes, two dimensional carbon nanosheets, graphite platelets, and the like. In some specific embodiments, the matrix of nanostructured material is multi-walled carbon nanotubes.

In the electrochemical cells of the present disclosure, in embodiments, the PSRCs are coupled to the matrix of nanostructured material in the anode by a cross-linking agent, such as, but not limited to, 1-pyrenebutanoic acid succinimidyl ester (PBSE) or other protein homo- or hetero-bifunctional cross-linking agent.

FIG. 1 provides an illustration of an embodiment of an anode composite of the present disclosure, showing the electrode, the matrix of nanostructured materials provided as multi-walled carbon nanotubes (MWCNTs), and a thylakoid membrane as a photosynthetic entity/PSRC including a combination of photosynthetic proteins and other photosynthetic compounds in electrochemical communication with the anode via the matrix of MWCNTs and PBSE likers.

Although the methods and photosynthetic electrochemical cells of the present disclosure allow for direct electron transfer between the PSRCs and the anode, in some instances it may be advantageous to include a redox mediator (also known as a redox shuttle) to facilitate transfer of electrons between the photosynthetic proteins and the nanostructured material/anode. In embodiments the redox mediator may be chosen from mediators such as, but not limited to, ferricyanide, quinone-based compounds, osmium complex based compounds, any other redox chemical compound and combinations of the above.

In embodiments of the photosynthetic electrochemical cells of the present disclosure, the cathode includes at least one compound capable of reducing a reductant, such as, but not limited to $O_2$, ferro/ferricyanide couple, and the like. In embodiments, the photosynthetic electrochemical cells of the present disclosure include a cathode composite including a cathode and a compound or combination of compounds capable of reducing a reductant, such as $O_2$. In embodiments, the cathode composite may also include a nanostructured material to facilitate electrochemical communication between the cathode and the oxygen-reducing compounds. The nanostructured material of the cathode composite can be any of the nanostructured materials described above in reference to the anode composite. In embodiments, the compound capable of reducing $O_2$ can include, but is not limited to, an enzyme or a metallic catalyst. In some embodiments the enzyme capable of reducing $O_2$ can include, but is not limited to, laccase, bilirubin oxidase, ascorbate oxidase, tyrosinase, catechol oxidase, and combinations of these or other enzymes. In embodiments the enzyme capable of reducing $O_2$ include a metallic catalysts such as, but not limited to platinum, silver, gold, cobalt, nickel, iron and combinations of these metals. In embodiments, the compound capable of reducing ferro/ferricyanide couple, can include but is not limited to, could be a metal, semiconductor or carbon or a chemical capable of reducing the ferro/ferricyanide couple.

In embodiments of the present disclosure the anode and cathode can be made of any standard electrode material, such as carbon, metals, semiconductor such as silicon, and the like. One advantage to the cells of the present disclosure is that the use of the nanostructured materials to couple the photosynthetic compounds or oxygen reducing compounds to the electrodes allows coupling of the photosynthetic compounds to the electrode without the need for expensive precious metal electrodes (e.g., gold, silver, platinum, etc.) and without complex immobilization procedures that are incompatible with other, less expensive electrode materials such as carbon.

Figure 7A:
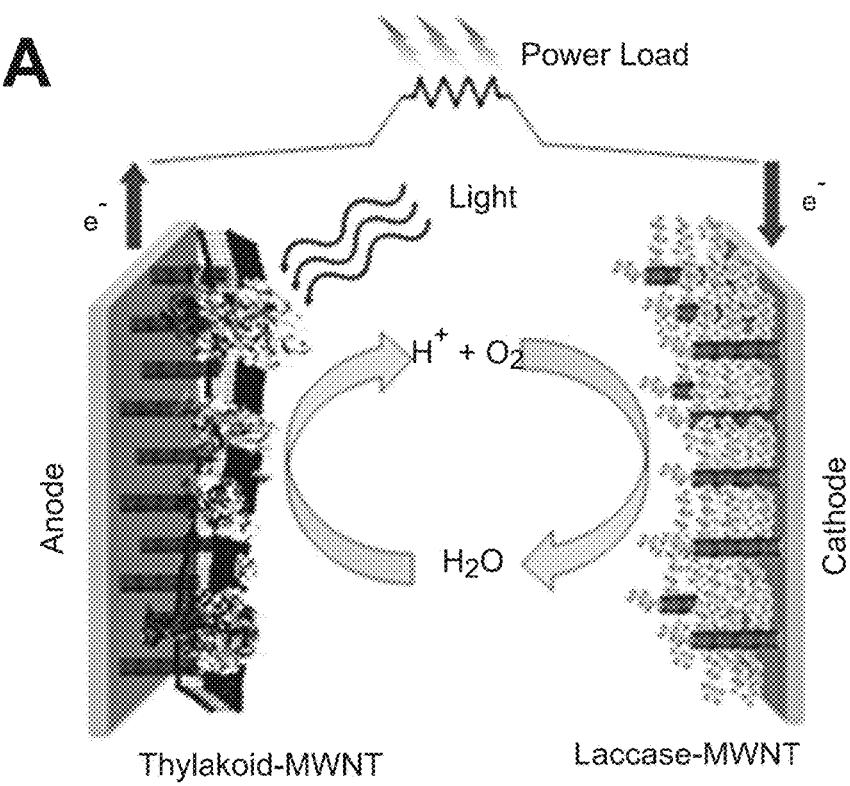
FIG. 7A illustrates a schematic representation of an embodiments of a photo-electrochemical cell of the present disclosure containing thylakoid-MWNT based photo-anode and laccase-MWNT based biocathode.

The examples below and the attached figures provide additional detail regarding some embodiments of the photosynthetic electrochemical cells of the present disclosure and the elements of the anode and cathode described above. FIG. 7A provides an illustration of an embodiment of an electrochemical cell of the present disclosure.

The methods of the present disclosure include methods of generating an electrical current including using the photosynthetic electrochemical cells of the present disclosure to convert light energy to electrical energy. In embodiments, the methods of the present disclosure include using thylakoid membrane photosynthetic proteins and compounds and/or photosynthetic bacterial proteins and compounds to harness light energy to oxidize a water molecule and directly transfer electrons from the photosynthetic proteins to an anode using direct electrochemical communication. In embodiments, methods of the present disclosure also include using the electrons from the anode to reduce $O_2$ at a cathode, thereby inducing a potential difference between the anode and the cathode and generating an electrical current.

Briefly described, some methods of generating an electrical current according to the present disclosure include providing an electrochemical cell that has an anode composite that includes a PSRC in electrical communication with an anode via a nanostructured material and a cathode composite capable of reducing oxygen. The electrochemical cell is exposed to light in the presence of water so that the PSRC uses light energy to oxidize water molecules and generate electrons, which are transferred to the anode via the nanostructured material, flow to the cathode, where they reduce oxygen, thereby inducing a potential difference between the anode and the cathode to generate an electrical current.

In embodiments the present disclosure includes methods of generating an electrical current by providing a photosynthetic electrochemical cell of the present disclosure and exposing the photosynthetic electrochemical cell to light in the presence of water, such that the PSRCs use light energy to oxidize a water molecule and generate electrons which are transferred to the anode via the nanostructured material, and the electrons generated at the anode flow to the cathode where they are used to reduce $O_2$ at a cathode, thereby inducing a potential difference between the anode and the cathode and generating an electrical current. The photosynthetic electrochemical cells used in the methods of the present disclosure can include an anode composite having photosynthetic reactions centers in electrical communication with an anode via a nanostructured material as described above and include a cathode or cathode composite capable of reducing $O_2$ or other reductant as described above.

Now having described the embodiments of the present disclosure, in general, the Examples, below, describe some additional embodiments of the present disclosure. While embodiments of the present disclosure are described in connection with the Examples and the corresponding text and figures, there is no intent to limit embodiments of the present disclosure to these descriptions. On the contrary, the intent is to cover all alternatives, modifications, and equivalents included within the spirit and scope of embodiments of the present disclosure.

EXAMPLES

Example 1

Manipulating Electron Transport Pathways in Thylakoid Composites for Photosynthetic Energy Conversion Spinach thylakoids were coupled to electrodes via multiwalled carbon nanotubes using a molecular tethering chemistry. The resulting thylakoid-carbon nanotube composite showed high photo electrochemical activity under illumination. It is believed to be the first time multiple membrane proteins have been observed to participate in direct electron transfer with the electrode, resulting in the generation of photocurrents. Thus, it is believed that the present disclosure describes the first of its kind for natural photosynthetic systems.

The high electrochemical activity of the thylakoid-MWNT composites has significant implications for both photosynthetic energy conversion and photofuel production applications. A fuel cell type photosynthetic electrochemical cell developed using thylakoid-MWNT composite anode and laccase cathode produced a maximum power density of 5.3 $\mu W\ cm^{-2}$ comparable to that of enzymatic fuel cells. The carbon based nanostructured electrode has the potential to serve as an excellent immobilization support for photosynthetic electrochemistry based on the molecular tethering approach as demonstrated in the present example.

Introduction

Plant photosynthesis has evolved over 2.5 billion years to convert solar energy into chemical energy using only water, with an unmatched quantum efficiency of nearly 100%[1, 2]. In recent years, there has been an increasing interest in mimicking the natural photosynthetic process for energy conversion and photo fuel (ethanol, $H_2$ etc.) production[3-5]. This is being carried out using synthetic routes such as metal oxides, semiconductors or chemical catalysts for carrying out the light-driven water splitting reaction[6-11]. Alternatively, components of the naturally occurring photosynthetic apparatus of bacteria[12], algae and plants[13-16] have been employed for bioconversion applications. For example, the direct conversion of light into electricity based on photosynthesis in an electrochemical cell has been investigated in the past[17-20], using natural systems such as thylakoids, chlorophyll molecules, photosynthetic reaction centers[21-28], and even whole cells such as cyanobacteria[29-31]. Besides these representative attempts, the low electron transfer efficiency of the photosynthetic machinery to the electrodes still plague the power output performance of these systems. Isolated photosynthetic components systems possess some advantages over whole cells, such not needing nutrients for sustenance, and not having competition between respiration and photosynthesis in sharing the electron transfer pathways. However when isolated plant photosynthetic systems have been used on electrodes they have suffered from low efficiencies due biomolecule stability, improper immobilization, lack of electrical communication, etc[10]. For light energy harvesting applications, it is thermodynamically advantageous to collect electrons directly from the molecules at high-energy states along the photosynthetic electron transport pathway, such as an excited photosystem II (PSII)[26,32,33]. Moreover, for direct light-electricity conversion applications, it is generally preferable to use a higher order plant based system that uses only water as the electron donor such as PSII, rather than isolated PSI complexes, which require an alternate electron donor. For this purpose, attempts have been made to immobilize PSII reaction centers on to the electrode using cytochromes[34] or nickel-nitrilotriacetic acid[35] as cross-linkers or through some terminal electron acceptors such as $Co^{III}$ complexes[36]. All these methods use precious metals (e.g., gold) as the immobilization support and use expensive immobilization procedures that cannot be extended to other electrode materials (e.g., carbon). Accordingly, the precious metal based electrochemistry carries less practical value for energy conversion applications.

On the other hand, photosynthetic organelles or membranes also possess advantages over isolated reaction center complexes for electrochemical applications. Some such advantages include: high individual protein stability[37], the ability to use simpler immobilization procedures, and the presence of multiple electron transfer routes. For example, if thylakoid membranes are used in the place of isolated PSII complex, then the electron transfer from an oxygen evolving complex (OEC) site to the electrode can be achieved via plastoquinone, cytochrome (cyt) $b_6f$, plastocyanin, ferredoxin, PSI, etc. in addition to a direct transfer from PSII[34]. Moreover retention of their natural partners results in enhanced stability of the individual proteins in thylakoids in comparison to their isolated counterparts[38]. Therefore using thylakoids as photo-biocatalysts or otherwise complexing photosynthetic proteins within a photosynthetic structure offers the potential for high photo-electrochemical activity as well as high stability for both energy conversion and fuel production applications.

The present example demonstrates the photo-electrochemical activity of spinach thylakoids immobilized on to multi-walled carbon nanotube (MWNT) modified electrodes. By employing a carbon-based material, the necessity for expensive precious metal-based catalyst supports to immobilize photosynthetic machinery onto electrode surfaces was eliminated. The molecular tethering approach described in the present example by using nanostructured materials to couple the photosynthetic structure to the electrode helps establish multiple attachments between the thylakoid membranes and the electrode surface. Moreover, the present example demonstrates that by using the entire membrane instead of isolated photosystem complexes, manipulation of the electron transfer pathways to achieve high electron transfer flux for photo current generation was possible. This example also demonstrates direct light to energy conversion with water as the only input using a photosynthetic fuel cell composed of a thylakoid based anode and laccase based cathode, first of its kind employing a plant photosynthetic membrane and an enzymatic cathode operating at neutral pH. A schematic of the thylakoid membranes immobilized on MWNT modified electrode and the associated electron transport pathways are shown conceptually in FIG. 1.

EXPERIMENTAL

Materials

Thylakoids were extracted from fresh organic spinach obtained from local market. MWNT, 10 nm diameter and 1-2 μm length (Dropsens, Spain) was used as the immobilization support for the thylakoids. 1-pyrenebutanoic acid succinimidyl ester (PBSE) (Anaspec) was used as the molecular tethering agent to attach thylakoids on MWNT. Potassium ferricyanide, redox mediator, and N,N-dimethyl formamide (DMF), solvent used for reagent preparation, were purchased from Acros Organics. 3-(3,4-dichlorophenyl)-1,1-dimethylurea (DCMU) was purchased from Tokyo Chemical Industry. Laccase from *Trametes versicolor* (Sigma) was the enzyme used on the cathode. Potassium cyanide (KCN) was purchased from Fisher Scientific. Paraquat/Diquat was purchased from Ultra Scientific. Tricine (OmniPur), sorbitol (EMD Chemicals Inc), ethylenediaminetetraacetic acid (EDTA) (VWR), and potassium hydroxide (Mallinckrodt Baker) were used for preparing buffer solutions. Phosphate buffer for electrochemical testing was prepared using monobasic and dibasic potassium phosphates (VWR). All buffers were prepared using nanopure distilled water (dd$H_2O$). Electrolyte (buffer) solutions were purged for 30 min with $N_2$ to remove any dissolved $O_2$.

Methods

Figure 8:
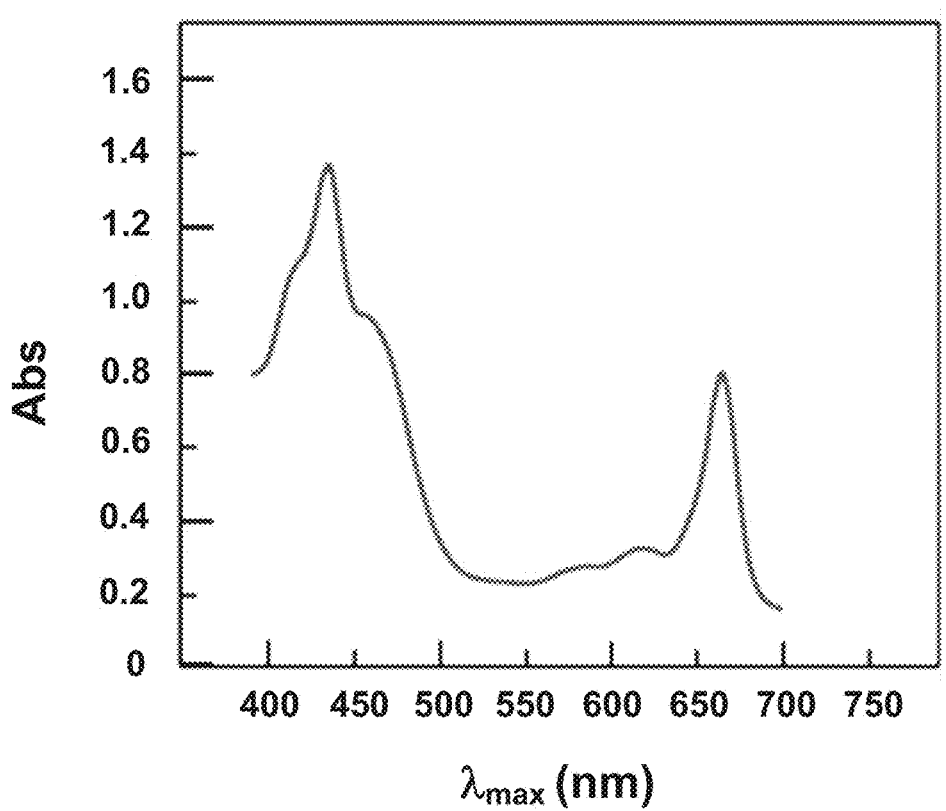
FIG. 8 illustrates a UV-Vis spectrum of suspended thylakoid membranes used to calculate chlorophyll concentration.

Thylakoids were isolated from *Spinacia oleracea* (spinach) leaves based on the procedure given in literature[39] using a refrigerated centrifuge (Beckman Coulter Avanti J-E). The procedure is known to produce a mixture of both intact organelles and broken thylakoid membranes. During isolation the chlorophyll concentration was determined to be between 2.5 and 3.0 mg mL$^{-1}$ (average of 2.8 mg mL$^{-1}$) via UV-Vis absorbance measurements using a spectrophotometer (UV-Vis) (Cary Varian 50 Bio, Sparta, N.J.) using the formula given in the FIG. 8. The oxygen evolution activity of isolated thylakoids was measured in oxygen deprived tricine buffer pH 7.8 with a standard Clark $O_2$ electrode. The isolated thylakoids were in the form of a pellet and was stored in the dark at −80° C. The pellets were re-suspended in the buffer when needed for electrode preparation. For control experiments, the DCMU exposed thylakoids were prepared by suspending thylakoids in 0.1 mM DCMU solution and incubated in ice bath for 30 min. Similarly in another control experiment, 250 μg ml$^{-1}$ solution of paraquat/diquat solution was used to suspend thylakoids and incubated in ice bath for 30 min.

Slurries of MWNT were prepared by dispersing 1 mg mL$^{-1}$ of MWNTs in 10 mM DMF by 10 min ultra sonication using an ultrasonic homogenizer (Omni International) at the power output of 20 watts. The dispersion was sonicated again for 1 h in a bath sonic cleaner (XP-Pro). The obtained MWNT dispersion was used as it is for electrode modifications.

A molecular tethering approach was used to immobilize thylakoid membranes on the carbon nanotube matrix using PBSE as the linker (e.g., tethering agent), which has been demonstrated to produce excellent bio-electrochemical characteristics[40-42]. In this method, first the electrodes (0.02 cm$^2$) were polished with 0.05 μm alumina slurry. The polished electrode was rinsed and ultrasonicated in dd$H_2O$ for 8 min. Then the electrode was modified with 4 μL of MWNT dispersion and later dried at 70° C. After drying, a desired volume of 10 μM PBSE was drop casted on the MWNT modified electrode and incubated for 15 min in an ice bath. The resulting modified electrode was washed first with DMF to remove the loosely bounded PBSE and then with tricine buffer to neutralize the pH of the electrode surface. Finally, 5 μL of thylakoid suspended solution (corresponds to 0.44 μg cm$^2$ chlorophyll loading) was drop casted on the electrode surface and incubated for 1 h in the dark in an ice bath. The modified electrode was then washed with tricine buffer prior to experimentation.

Testing

Bare or thylakoid modified MWNT was used as the working electrode in a 3-electrode electrochemical cell setup with a platinum wire counter electrode (Alfa Aesar) and a silver-silver chloride (Ag/AgCl) reference electrode (CH Instruments). All electrochemical experiments were conducted at 25±2° C. using 0.1 M tricine buffer pH 7.8 as the electrolyte. Electrochemical tests were performed both in the presence and absence of $[Fe(CN)_6]^{3-/4-}$ as a redox mediator. The operating conditions for electrochemical tests were chosen based on a series of optimization tests for thylakoid loading, immobilization duration, mediator concentration and anode potential over a reasonable range, the results of which are given in FIGS. 9A-9B. The $O_2$ evolution activity during experiments was monitored via a Clark-type $O_2$ electrode (VWR Symphony Dissolved Oxygen Probe). Cyclic voltammetry (CV), current vs. time (i-t curve, steady state current) and electrochemical impedance spectroscopy studies were conducted using CHI-920c model potentiostat (CH Instruments). A Dolan-Jenner Industries Fiber-Lite model 190 lamp was used for light illumination with 'high' intensity setting of 80 mW cm$^{-2}$. Surface morphology of the immobilized thylakoids was studied using a scanning electron microscope (SEM) (FEI Inspect F FEG-SEM), atomic force microscope (AFM) (Veeco Multimode Nanoscope). Absorption spectra were obtained using Genesys 10S UV-Vis spectrophotometer (Thermo Scientific). The photosynthetic fuel cell was constructed using thylakoid-MWNT composite modified anode and laccase-MWNT composite modified cathode. The electrodes were held inside a glass vial containing 0.1 M phosphate buffer solution (pH 6.8) as electrolyte. No oxygen was bubbled during the experiment and the oxygen available in the electrolyte was reduced to water at the cathode.

Chlorophyll Concentration Measurements

The chlorophyll concentration (Cch) was calculated by using the data from UV-Vis spectrum into the equation (E1).

$$C_{ch}\left(\frac{mg}{mL}\right) = \frac{8.02 \times A663 + 20.2 \times A645}{10} \rightarrow (E1)$$

Optimization of Composite Composition

The plots of current versus time at fixed anode potentials were used as a guiding tool for optimizing the thylakoid-MWNT composite electrode (FIGS. 9A-D). The parameters optimized were thylakoid immobilization time (FIG. 9A) and thylakoid concentration in the immobilization mixture (FIG. 9B), mediator concentration (FIG. 9C), and the anode polarization potential (FIG. 9D). The results showed the photocurrent was directly proportional to thylakoid concentration; however, only a maximum of 0.44 μg cm$^{-2}$ of thylakoids could be immobilized due to the limited geometric size of the electrodes being used in the experiment. Similarly, it was noticed that incubation durations (for immobilization of thylakoids on MWNT matrix) beyond 1 h did not result in a significant increase in photocurrents. The photocurrent was also proportional to the mediator concentration, but the percent decrease of photocurrent per duty cycle varied. The optimized mediator concentration obtained was 1.5 mM, where the photocurrent was 0.9 μA for the first cycle while still maintaining stability through multiple cycles. The anode potential was also optimized at 0.2 V to observe noticeable photo-activity.

Results and Discussion

Physical Characterization

Figure 2:
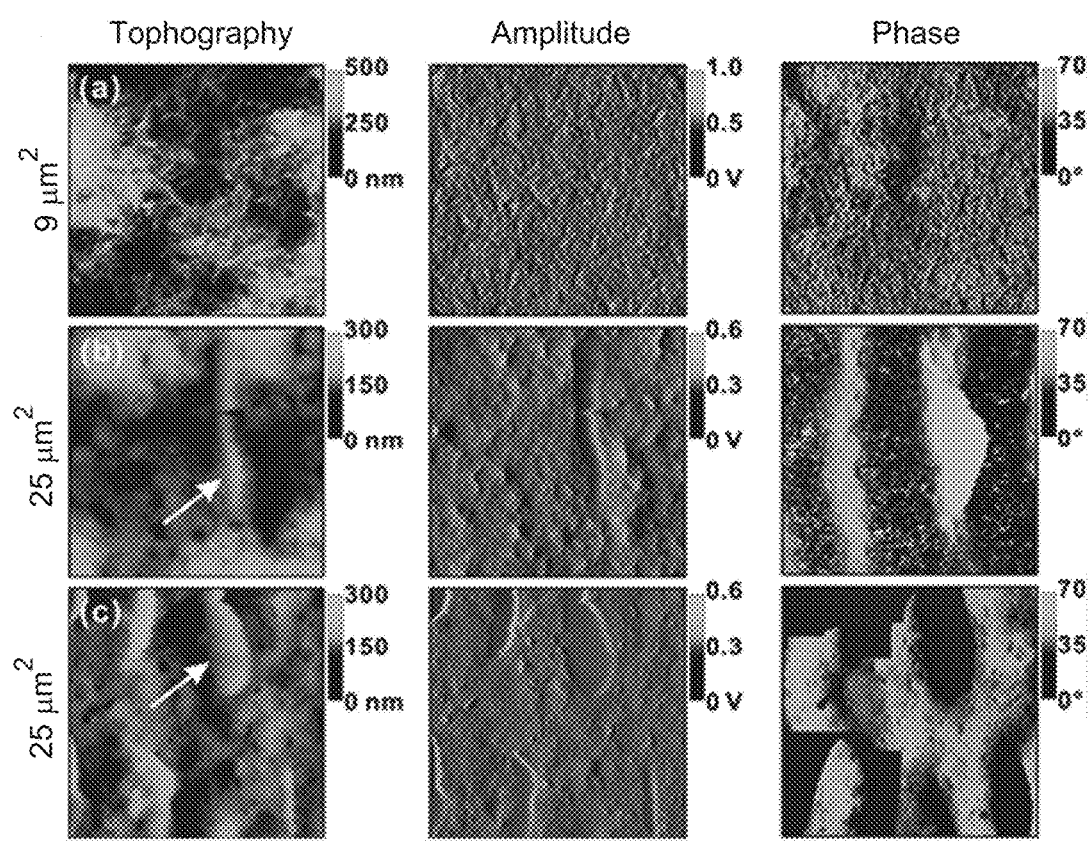
FIG. 2 is a group of digital AFM images of gold electrodes modified with (a) MWNT without thylakoid (b) thylakoid-MWNT composite and (c) thylakoid without MWNT. The topography, amplitude, and phase images correspond to left, middle and right columns respectively. Thylakoids are marked by the arrows in the images.
Figure 3A:
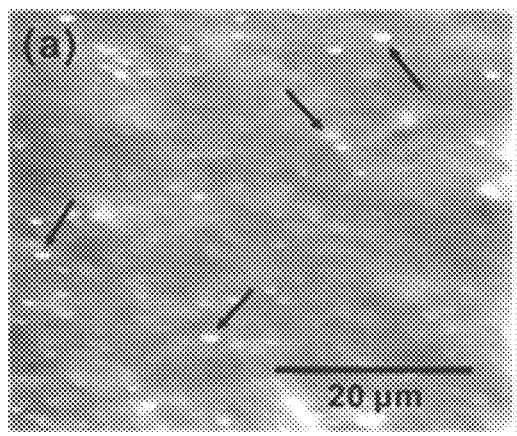
FIGS. 3A-3B are a group of SEM images of bare electrode modified with (3A) thylakoids, (3B) MWNT and (3C) thylakoids-MWNT composite. Thylakoids are shown by the arrows.
Figure 3B:
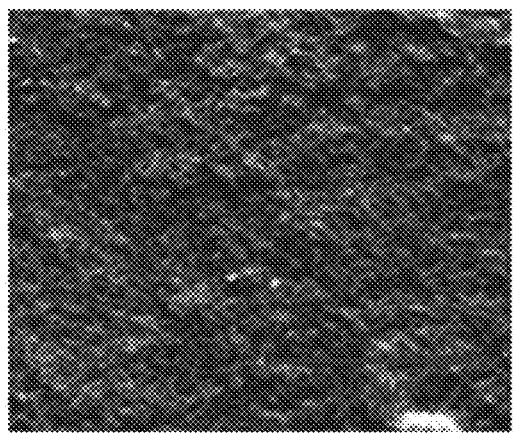
Figure 3C:
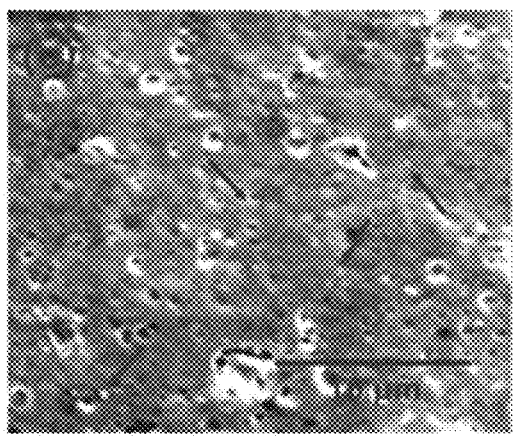

Tapping mode AFM and SEM were used to study the morphology of thylakoid-modified MWNT electrodes. The AFM topography, amplitude and phase images of the unmodified MWNT (control) and thylakoid-modified MWNT electrodes are shown in FIG. 2. The unmodified control electrode with the bare MWNT matrix shows clear and identifiable nanotubes as seen in FIG. 2A. The thylakoid modified-MWNT composite matrix shown in FIG. 2B has a similar morphology as that of the control, but with distinct thylakoids on the surface. Due to the blanketing effect of biological structures, the underlying MWNT fibrils in the composite are not obvious in the topography image, but are evident in amplitude and phase images in FIG. 2B. The presence of thylakoids is shown by the lighter extruding region in the composite (FIG. 2B), sized approximately 3 μm±0.5 in length which agrees with the typical size of a thylakoid unit[43]. A thylakoid modified electrode surface in the absence of MWNT is also shown in FIG. 2C for comparison and verification. The surface roughness of the thylakoid matrix is 9 nm±0.5, which is close to the roughness of a monolayer. The roughness values are similar for both thylakoids (FIG. 2C) and thylakoid-MWNT composite matrices (FIG. 2B). The surface coverage of active membrane proteins of thylakoids on the electrode surface is discussed in section 3.3.1. The morphology studied using SEM also show the length of thylakoids to be 3 μm±1 as shown in FIG. 3. This is in good agreement with the AFM observations.

Electron Transfer Pathways in Thylakoids

The thylakoid membrane consists of several integral membrane proteins that could partake in in electron transfer to the electrode. As schematically depicted in FIG. 1, electrons generated as a result of the photo-induced water oxidation reaction at the OEC site of PSII complex in thylakoids could be conducted to the electrode in three possible routes as indicated by arrows in FIG. 1. The arrows (a) indicate the first electron transfer pathway (ETP1): PSII→plastoquinone→cyt b6f→MWNT→electrode. ETP1 is possible if the cyt b6f is adsorbed or molecularly tethered to MWNT surface and its redox site placed closely to MWNT to enable direct electron transfer. The second possible electron transfer pathway (ETP2) is depicted by arrows (b): PSII→plastoquinone→cyt b6f→plastocyanin→MWNT→electrode. Here the electron gets routed to plastocyanin before reaching the MWNT matrix. Since plastocyanin may freely diffuse between the stromal and lumenal sides of a ruptured thylakoid membrane (as in the case of our experiments) it is likely to participate in the electron conduction as well. Both ETP1 and ETP2 serve as direct electron transfer routes for electrochemical charge transfer. Upon the addition of a mediator such as $[Fe(CN)_6]^{3-/4-}$, a third pathway as indicated by arrows (c) is also possible for electron conduction to the electrode (ETP3): PSII→plastoquinone→cyt b6f/plastocyanin→$[Fe(CN)_6]^{3-/4-}$→MWNT→electrode. In this case, ferricyanide mediates the electron transfer from multiple membrane proteins in the thylakoid to the MWNT electrode. Therefore the lack of electrical connectivity between those membrane proteins and electrode is not of a concern.

In addition to the three ETPs discussed above, other routes for electrochemical communication between thylakoids and MWNT electrode are possible. For example, a direct electron transfer from plastoquinone site of PSII to MWNT is possible if the stromal side of PSII complex is orientated towards the electrode. However the present experimental results (discussed in the following paragraphs) indicated no significant contribution from any additional routes to the electrochemical charge transfer and hence were not depicted in FIG. 1 or explored in detail. Also, since the primary focus of this example is on the electrons generated at PSII complex by water splitting reaction, other ETPs originating from PSI[44] or from electrolyte impurities[45] are not discussed here.

Redox Electrochemistry of Immobilized Thylakoid Membranes

Direct Electron Transport

Figure 10:
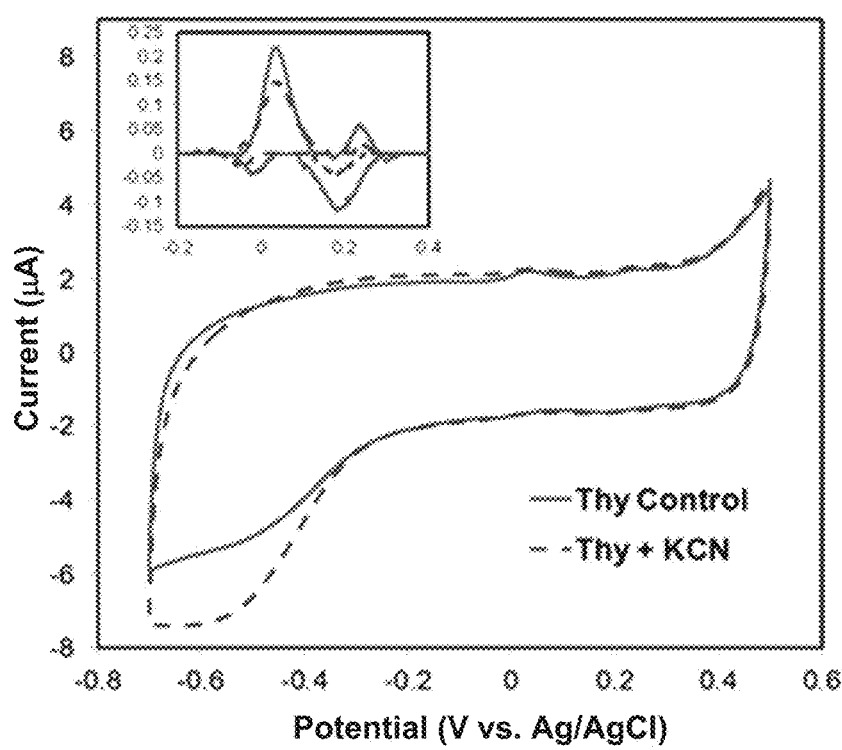
FIG. 10 illustrates cyclic voltammograms of thylakoid-MWNT composites in the presence and absence of 10 mM KCN as plastocyanic inhibitor.

Cyclic voltammetry was used to study redox activity of the unmodified and thylakoid-MWNT composite modified electrodes and to verify the existence of the ETPs discussed above in FIG. 1. The electrodes were cycled between −0.7 to 0.5 V vs. Ag/AgCl at a scan rate of 0.02 V s$^{-1}$. FIG. 4A compares the cyclic voltammograms of thylakoid-MWNT composites in the presence and absence of [Fe(CN)$_6$]$^{3-/4-}$ as mediator. The formal potential ($E^0$) values for peaks $1_{peak}$ and $3_{peak}$ as observed in our results were at ~0.035 and ~0.2 V (see FIG. 4A), which fell closely with that of the redox potentials of cyt b$_6$f (Fe$^{II/III}$) and plastocyanin (Cu$^{I/II}$), respectively, when the pH difference was accounted[46-48]. No redox peak directly attributable to plastoquinone was observed in our experiments, which is located inside the thylakoid lipid bilayer. The surface coverage of the cyt b$_6$f and plastocyanin was $1.2\times10^{-9}$ and $0.6\times10^{-9}$ mol cm$^{-2}$ respectively. These values were calculated using the equation Γ=Q/nFA, where Γ is surface coverage, Q is the charge measured from the cyclic voltammogram's cathodic peak, n is the number of electrons, F is the Faraday constant, and A is the geometric area of the electrode. Since thylakoids may exist as broken membrane particles instead of intact organelles in our samples, the observance of redox peaks for a lumen-side soluble protein such as plastocyanin is not surprising. The cyt b$_6$f and plastocyanin redox centers are much smaller than other reaction center complexes such as PSII and PSI. Therefore, naturally the MWNTs have easier access to cyt b$_6$f and plastocyanin for a direct electrochemical charge transfer resulting in distinct redox peaks as observed in FIG. 4A. To confirm that the peaks at 0.2 V can be attributed to plastocyanin redox activity, a separate plastocyanin-inhibition experiment was conducted to study the effect of inhibition on this redox peak. For this purpose KCN (10 mM) was added as an inhibitor to the thylakoid solution prior to immobilization. KCN inhibits the plastocyanin activity in photosynthesis by blocking its CuI/II active site at high concentrations (>10 mM) and high pH values (>7.5)[49]. The voltammograms of thylakoid modified MWNT electrode with KCN inhibitor showed a dramatic 73% reduction in the oxidation peak at 0.2 V as shown in supplementary FIG. 10. This supports the conclusion that the redox response in the 0.19 V-0.2 V range was that of plastocyanin in thylakoid modified electrodes. This is one of the few reports that demonstrate a direct electrochemistry for thylakoid-based electrodes.

Mediated Electron Transport

Figure 11:
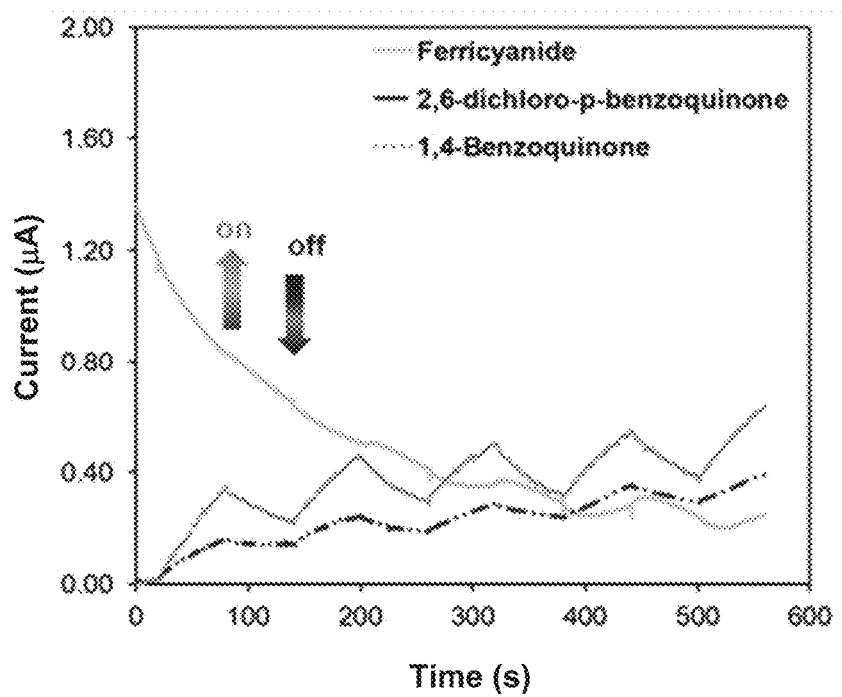
FIG. 11 is a graph illustrating photocurrent responses of 1.5 mM 2,6-dichloro-p-benzoquinone and 50 mM 1,4-benzoquinone mediators on MWNT electrodes in the absence of thylakoids. The photocurrent response of ferricyanide mediator is also shown for comparison.
Figure 12A:
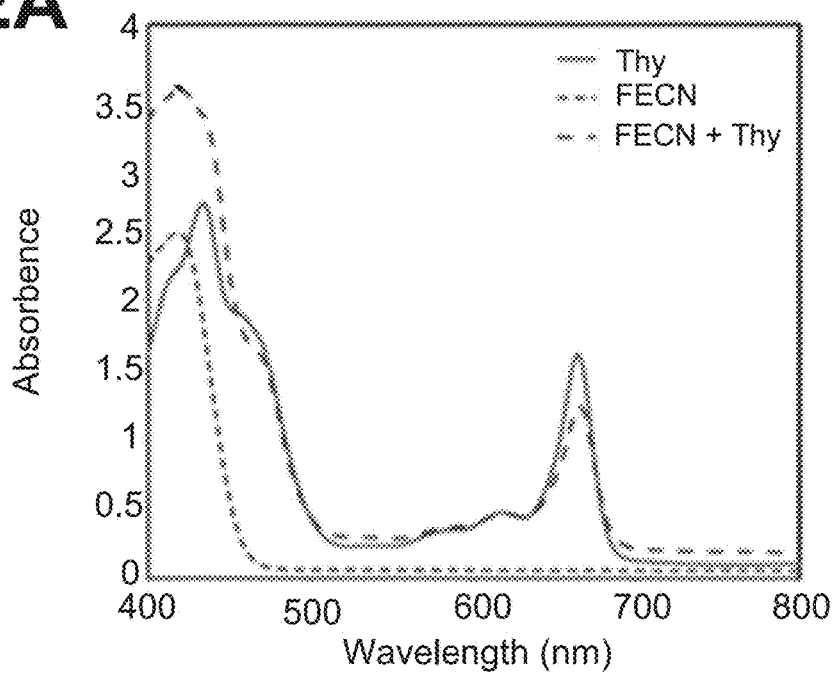
FIGS. 12A-12D illustrate the absorption spectrum of thylakoid membranes with exposure to ferricyanide mediator (FIG. 12A), KCN (FIG. 12B), paraquat/diquat (FIG. 12C), and DCMU herbicide (FIG. 12D).
Figure 12B:
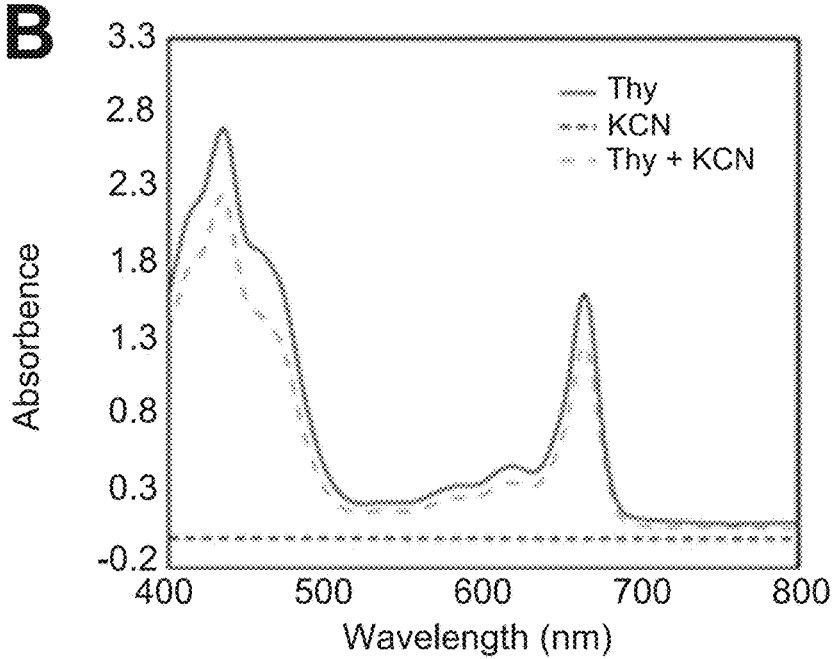
Figure 12C:
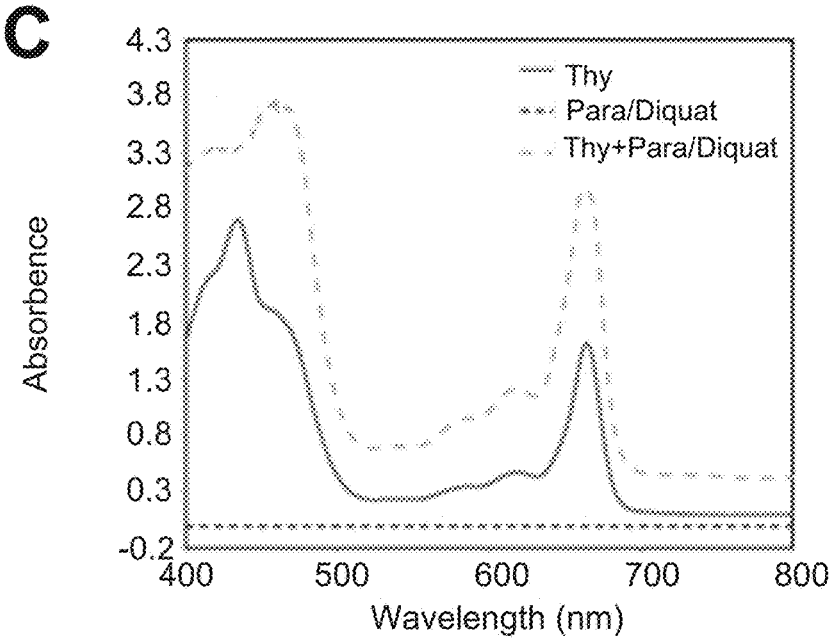
Figure 12D:
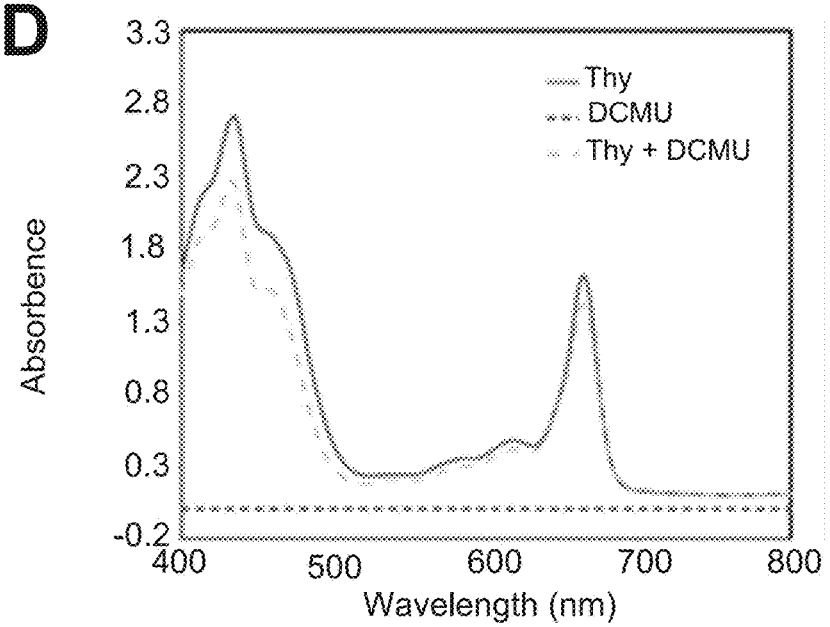

In a separate set of experiments, 1.5 mM [Fe(CN)$_6$]$^{3-/4-}$ couple was added to the electrolyte to assist electron transfer from thylakoid membrane to the MWNT electrode. Ferricyanide is a suitable choice because of its minimal photo-activity[50,51], compared to benzoquinone mediators used elsewhere[52], as confirmed in separate studies (see FIG. 11 for relevant data). As shown in FIG. 4A, in the presence of [Fe(CN)$_6$]$^{3-/4-}$, a single dominant oxidation peak ($2_{peak}$ at $E^0$ 0.16 V) was observed masking the redox responses of both cyt b6f and plastocyanin observed. This confirms the existence of mediated electron transport pathway (ETP3) as suggested in FIG. 1. This also indicates that the electron flux due to mediated transport was much higher than that of direct transport through the membrane bound proteins. The O$_2$ evolution due to photo-induced water splitting in thylakoid modified MWNT electrodes upon illumination is also evident in the voltammograms of FIG. 4B. The oxygen reduction and ferricyanide oxidation were observed at $E_{pc}$=−0.4 V and $E_{pa}$=0.3 V vs. Ag/AgCl respectively in FIG. 4B. Upon illumination the peak currents for their reactions increased by 1.0 ($I_{pa}$) and 0.2 ($I_{pc}$) μA respectively indicative of photo-catalysis by immobilized thylakoids. The rate of oxygen evolution from the photo-induced water oxidation was measured to be 253 μmol O$_2$ mg chl$^{-1}$ h$^{-1}$ (using a Clark electrode) indicating high photo-activity of the reactions centers complexes in thylakoids. The results suggest that the electron flux to electrode could be greatly enhanced by [Fe(CN)$_6$]$^{3-/4-}$, which acts as mediator for electrochemical charge transfer between thylakoid and MWNT electrode. To ensure that the mediator did not interfere with light-absorbance activity of thylakoids, individual absorption spectra were obtained for both thylakoids (in 80% acetone solution) and [Fe(CN)$_6$]$^{3-/4-}$ couple using UV-Vis spectroscopy. As shown in FIG. 12A, the absorption spectrum for [Fe(CN)$_6$]$^{3-/4-}$ mediator did not show any absorbance at 673 nm, the wavelength at which chlorophyll-a absorbs light in PSII. Also the presence of mediator did not hinder the light absorbance of chlorophyll-a molecule in our thylakoid-MWNT composites (see FIG. 12A for relevant data).

Photo-Electrochemical Activity of Thylakoid-MWNT Composites

The photo-electrochemical activity of thylakoid modified MWNT electrodes were evaluated using open circuit potential (OCP), potentiostatic polarization, and AC impedance measurements.

Open Circuit Potentials

Figure 5A:
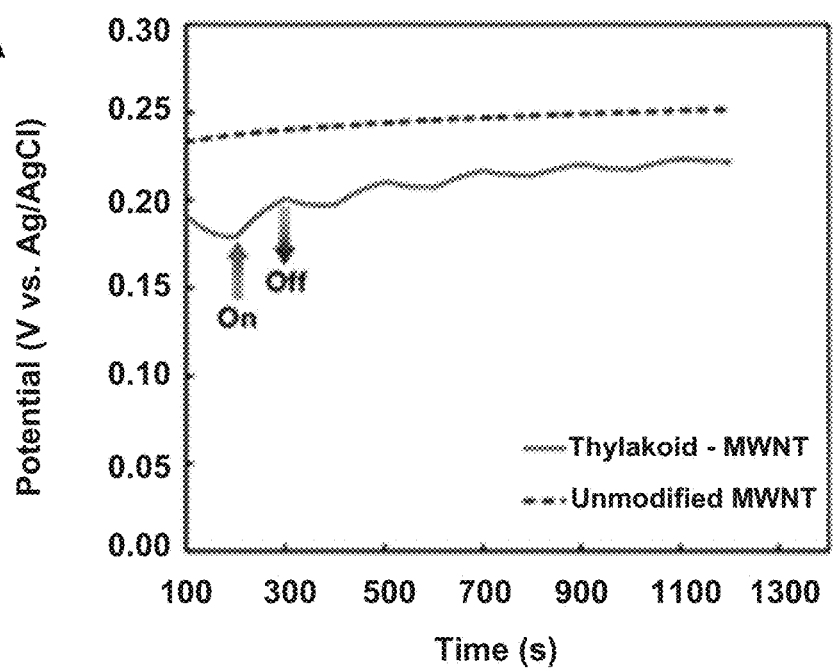
FIG. 5A is a graph of pen circuit potentials of unmodified (control) and thylakoid modified MWNT electrodes in the presence of 1.5 mM $[Fe(CN)_6]^{3-/4-}$.

FIG. 5A compares the open circuit potentials (OCPs) of unmodified and thylakoid modified MWNT electrodes in the presence of mediator. Within 100 seconds after the addition of mediator under dark condition, the OCP of the unmodified and thylakoid modified MWNT electrodes stabilized at 0.23 and 0.19 V, respectively. The slightly lower OCP for thylakoid-MWNT electrode could be dictated by the mixed potential caused by a variety of thylakoid membrane proteins whose individual redox potentials range from −1.3 to +1.0 V vs. SHE[46]. Upon changing the illumination conditions between light and dark over several light on-light off cycles, a clear variation in the open circuit potential was observed, indicative of photo-electrochemical activity for the thylakoid-MWNT composite electrode. The variation was as high as 90 mV during the first on-off cycle, which eventually subsided during subsequent cycles consistent with the attainment of dynamic equilibrium over time. No such variation in OCP between light and dark was observed for the unmodified MWNT electrode (control) in FIG. 5A.

Potentiostatic Polarization

Figure 13:
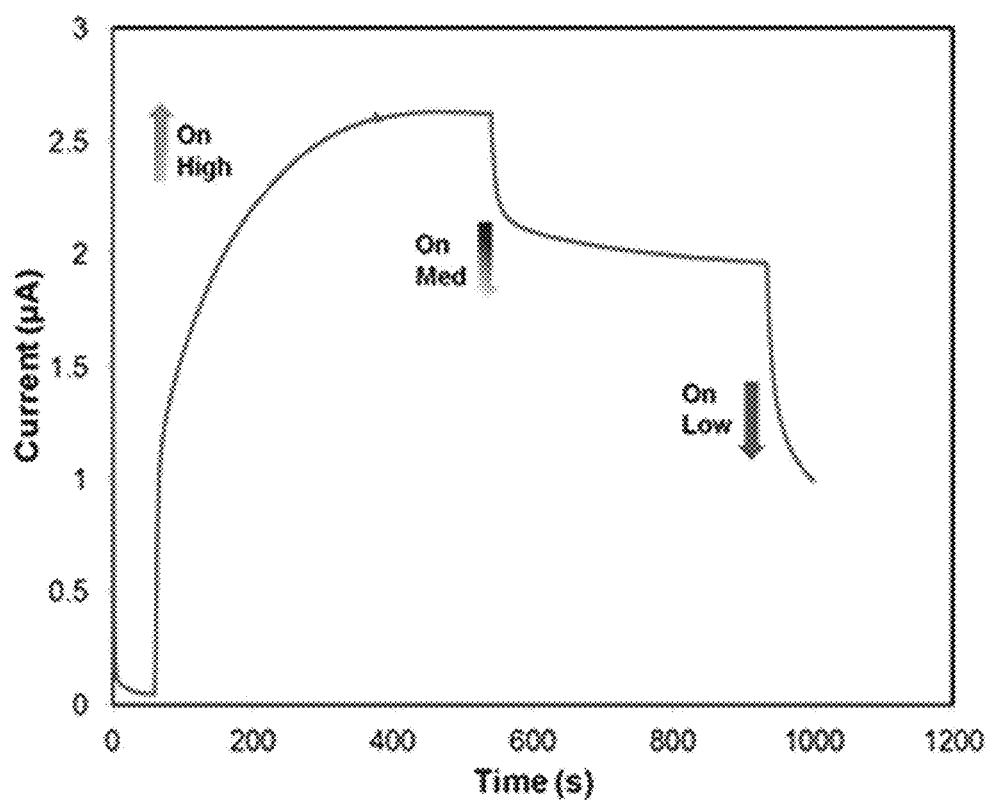
FIG. 13 is a graph illustrating the effect of light intensity on thylakoid-MWNT composites. High light intensity was turned on at 60 s, medium at 540 s and low light at 920 s.

The photo-electrochemical activity of the thylakoid-MWNT composite was evaluated at constant anode potential of 0.2 V and the variation of anode current with time was evaluated during light on-light off cycles. The photocurrent densities ranged from 30 to 70 μA cm$^{-2}$ during initial cycles eventually attaining steady state within ≈400 s in the range of 23 to 38 μA cm$^{-2}$ that lasted for 1 week. (FIG. 13). Table 1 compares the photo-current densities observed in this example with that of other photosynthetic systems reported in the literature and shows that the anodic photocurrents observed here are about two orders of magnitude larger than the highest values reported in the literature for natural plant systems, either PSII based energy conversion[52-54] or PSI based bio-hydrogen production[55].

TABLE 1

Comparison of various photosynthetic anode's photocurrent density.

| Electrode material | Photocurrent/area[b] | Reference |
|---|---|---|
| Au-MWNT-Thylakoid | 68 µA cm$^{-2}$ | This work |
| Au-poly(mercapto-p-benzoquinone) | 3.1 µA cm$^{-2}$ | 52 |
| Au nanoparticles-PSII | 2.4 µA cm$^{-2}$ | 53 |
| Au-Thylakoid | 0.2 µA cm$^{-2}$ | 60 |
| Au-PSII | 0.1 µA cm$^{-2}$ | 54 |
| Au-Thylakoid | 1.1 µA cm$^{-2}$ | 61 |
| Au SAM-RC-RBS[a] | 0.2 µA | 34 |
| Carbon coated Au-RC-RBS | 0.05 µA | 62 |

Figure 15A:
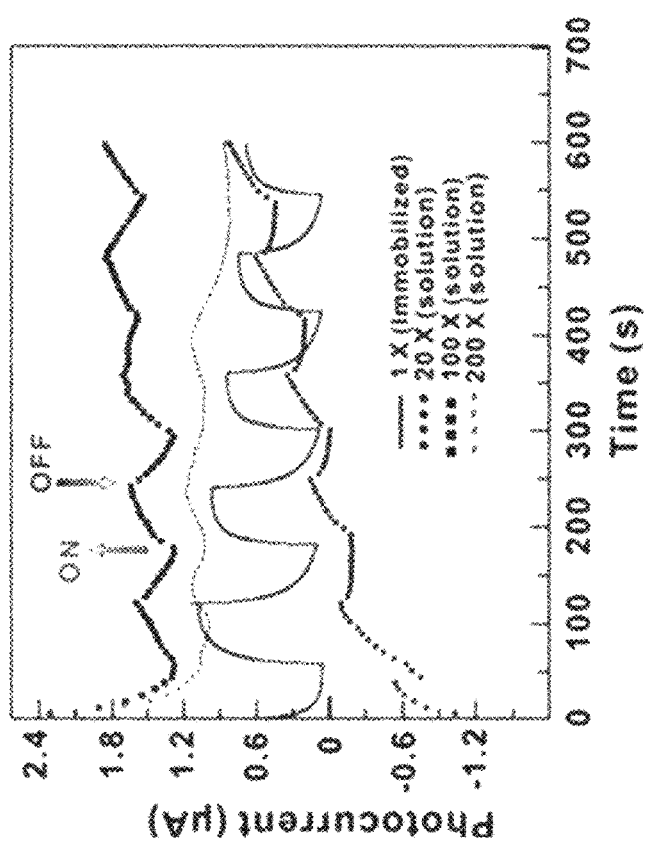
FIGS. 15A-15B illustrate a comparison of immobilized thylakoids (1×) with various quantities (20×, 100×, 200×) of suspended thylakoids in solution.
Figure 15B:
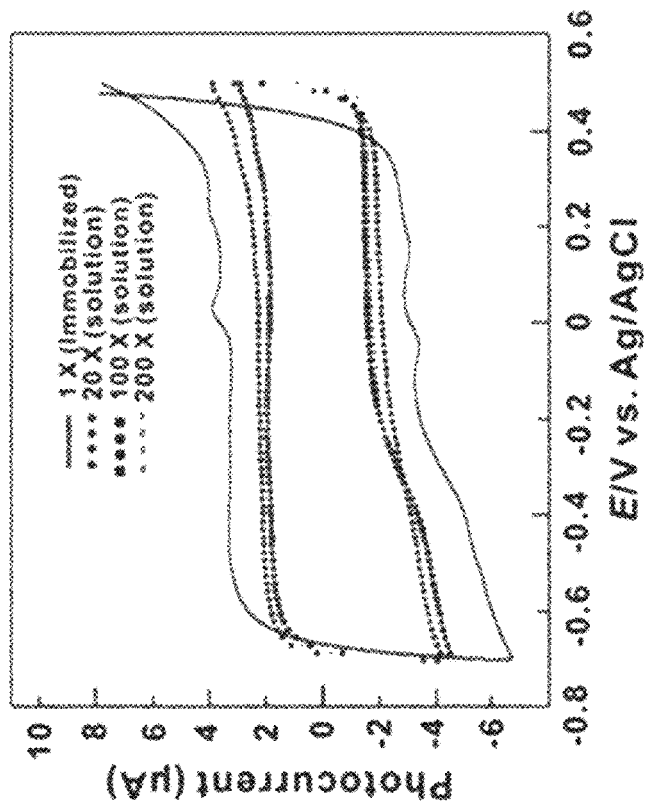

[a]SAM—self assembled monolayer; RC—reaction center; RBS—*Rhodobacter sphaeroides*
[b]Photocurrent density was calculated using the photocurrent and the active surface area provided in the respective literature The thylakoid-MWNT composite was also found to be very responsive to the light intensity (see FIG. 13 for light intensity data). No significant photo-electrochemical activity was noticed for the unmodified MWNT electrode without thylakoids or for thylakoids physically adsorbed onto the MWNT without the tethering cross-linker. The small photocurrents seen in the case of unmodified MWNT in FIG. 4B, was primarily due to the light absorbance of Fe(CN)$_6]^{3-/4-}$ in the 410-420 nm range which did not interfere with the light absorbance of chlorophyll in thylakoids in the 660-675 nm range (as shown in the absorption spectrum in supplementary FIG. 12A). In order to understand if immobilized thylakoids have significant advantages over freestanding suspended thylakoids in solution, separate polarization experiments were performed using thylakoids suspended in the electrolyte without immobilization on MWNT electrodes. For such electrodes the photo-electrochemical activity was drastically reduced (as shown in FIGS. 15A and 15B), indicating that the composite based immobilization methods are best suited to establish high photo-electrochemical activity in natural systems.

Figure 5B:
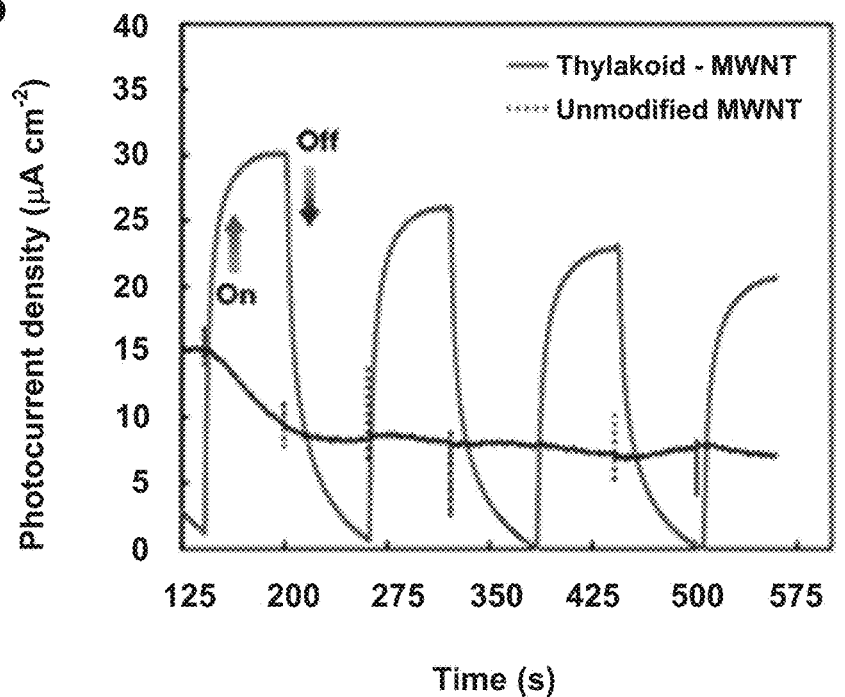
FIG. 5B illustrates a graph of photo-current responses of unmodified (control) and thylakoid modified MWNT electrodes at a fixed potential of 0.2 V in the presence of 1.5 mM $[Fe(CN)_6]^{3-/4-}$.

The decrease in the amplitude of photo-currents over continuous light on-off cycles observed in FIG. 5B could be due to a combination of two effects: (i) transience in mediator diffusion between thylakoid and electrode before the attainment of a steady state; (ii) photo-damage of proteins under extended light exposure[56]. The contribution of the first effect was studied and confirmed in a separate set of experiments where the thylakoid-MWNT composite electrodes were tested under different duty cycles (different ratios of Time$_{on}$/Time$_{off}$) as well as under continuous light on and continuous light off (dark) conditions (see supplementary FIGS. 14A-14B for relevant data). The second effect namely photo-damage (photoinhibition) occurs under continuous and extended illumination conditions[57] and is an inherent property of natural systems. In plants, natural biological mechanisms repair the photo-damaged proteins[58].

AC Impedance

Figure 5C:
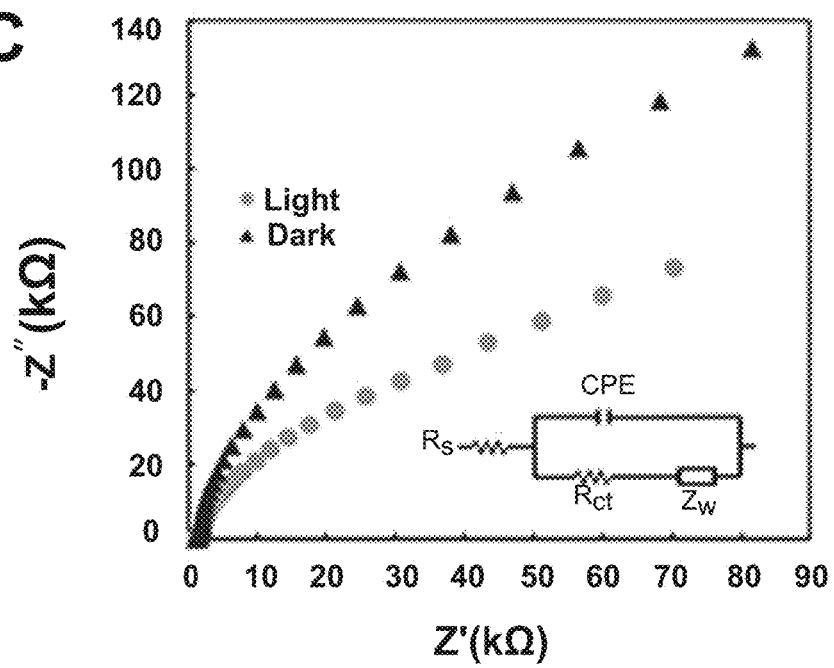
FIG. 5C illustrates Nyquist plots (Z' vs. -Z") for thylakoid-MWNT composites under light and dark conditions. Inset in FIG. 5C shows the equivalent circuit model used to fit the Nyquist data.

AC impedance studies were also carried out on thylakoid-MWNT composites under light and dark conditions in the presence of mediator to understand the influence of individual resistances on photocurrent generation. The Nyquist plots (-Z" vs. Z') of the impedance data and the equivalent electrical circuit (to which the data was fitted for parametric analysis) are given in FIG. 5C. $R_s$ represent electrolyte resistance, $R_{ct}$ is charge transfer resistance, CPE is a constant phase element between the electrolyte solution and the modified electrode, and lastly $Z_w$ represents the Warburg impedance due to the diffusion of mediator. The shape of the Nyquist profiles shows a clear difference in the impedance between light and dark condition, with the composites showing lower impedance for charge transfer under the illuminated condition. The fitted values for $R_{ct}$ were 87 and 317 kΩ under light and dark, respectively. The results indicate an enhanced kinetic activity due to lowered charge-transfer impedance for electrochemical charge transfer in thylakoid-MWNT composites under illumination. Though a Warburg element was included in the equivalent circuit to ensure completeness in the representation of the system, the diffusion limitations were not observed to play a major role in this kinetic limited system, as can be noticed in the shape of the Nyquist plots in FIG. 5C, where there was no 45° Warburg slope. At the same time, an equivalent circuit without the Warburg component did not result in the perfect fit of the equivalent circuit data indicating that Warburg and kinetic impedances ($R_{ct}$) were expressed with similar time constants.

An impedance observation in the absence of mediator also showed high charge transfer impedance indicating this system was not limited by the mediator diffusion. Separate measurements performed on thylakoid modified electrodes with and without MWNT platform indicated lower ohmic resistance (after eliminating the solution impedance contribution) for the MWNT electrodes. This confirmed the existence of high electronic conductivity for the thylakoid-MWNT composite electrodes.

Role of PSII vs. PSI in Photocurrent Generation

Figure 6:
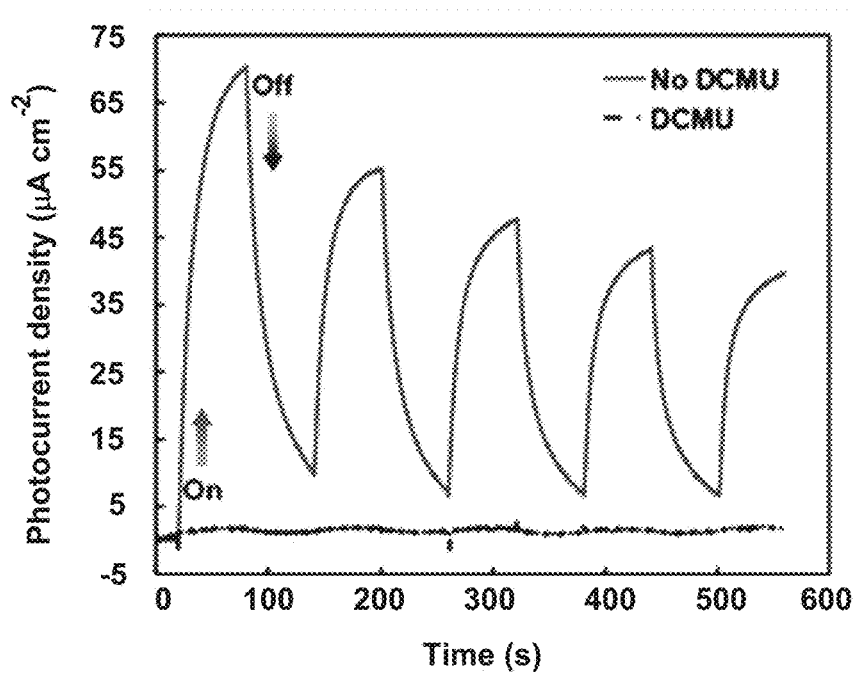
FIG. 6 is a graph illustrating a comparison of the photo-current responses of unexposed and DCMU exposed thylakoid-MWNT composites. ↑ and ↓ represent light on and light off conditions, respectively.

In order to confirm that the light-induced water splitting reaction is the electron source for the observed photocurrents in our composite electrodes, two control experiments were performed. The first control experiment was aimed at studying the effect of blocking the PSII reaction center complex and the second was aimed at blocking the PSI reaction center complex from participating in the photosynthetic electron transport. For inhibiting PSII activity, 3-(3, 4-dichlorophenyl)-1,1-dimethylurea (DCMU) was added to the thylakoid solution prior to immobilization. DCMU is a herbicide that specifically blocks the $Q_A \rightarrow Q_B$ site in PSII complex, severing the electron transport from PSII to the subsequent proteins in the pathway[59]. As shown in FIG. 6, potentiostatic tests at 0.2 V on thylakoid-MWNT composites showed that when DCMU was used, the thylakoid activity was severely inhibited thereby drastically reducing the photocurrents during the light on-off tests. This confirms that the electrons originate from PSII. Interestingly the cyclic voltammograms thylakoid-MWNT composites (FIGS. 19A-19B) showed retention of redox electro-activity by both cyt b$_6$f and plastocyanin even when PSII was inhibited by DCMU. This suggests that blocking the PSII complex with DCMU did not significantly affect the redox activities of the other thylakoid membrane proteins individually, an indication that the direct electron properties of thylakoid can be utilized for electrochemical charge transfer as suggested above. The inhibition of PSI (as shown in supplementary FIG. 17) reveals that the presence of the PSI inhibitor did not significantly reduce the photo-electrochemical response of the thylakoid-MWNT composites. The results reiterate that water oxidation at PSII was the major source for photocurrents in the thylakoid composites and contribution of PSI complex to photocurrent generation was insignificant in the present study. This also confirms that the major routes for electron conduction from OEC site to the electrode were the three ETPs proposed in FIG. 1, which presumes that all the membrane integral proteins in thylakoid membrane are intact and participate in photosynthetic linear electron transport.

Thylakoid-Laccase Photosynthetic Electrochemical Cell

Figure 7B:
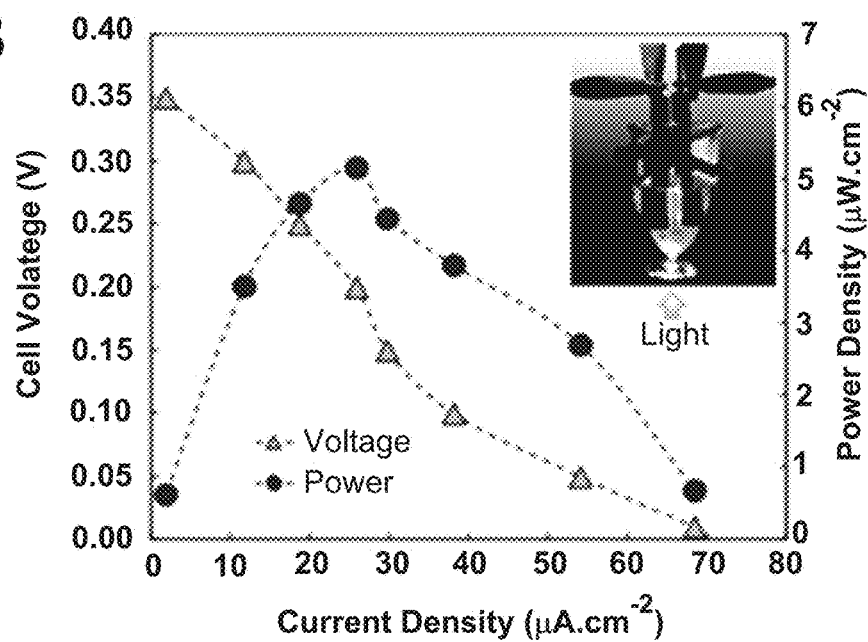
FIG. 7B is a graph of the steady state polarization and power density curves of the photo-electrochemical cell. A digital image of the simple photo-electrochemical cell setup is shown in the inset.

A fuel cell type electrochemical cell was constructed using the thylakoid-MWNT composite anode and laccase-MWNT composite cathode and tested in an electrolyte solution (PBS buffer pH 6.8). The anode oxidizes water upon illumination with light using thylakoid-MWNT composites as photo-biocatalysts, whereas the cathode reduces oxygen to regenerate water in the system using laccase as an enzymatic bio-electrocatalyst. The use of laccase for bio-electrocatalytic oxygen reduction in biological fuel cells has been well established[40-42]. The molecular tethering approach used for thylakoid immobilization was also used for laccase immobilization on MWNT at the cathode. The open circuit potential of cell was ~0.4 V. Polarization tests were performed under illumination, at constant applied potentials between 0.35 V and 0 V and the resulting steady state currents were measured and shown in FIG. 7. The polarization curves showed a maximum current density of ~70 $\mu A/cm^2$ and a maximum power density of 5.3 $\mu W/cm^2$. The power density values were comparable to the ones reported for PSII electrochemical cell using gold-poly(mer-capto-p-benzoquinone) anode and bilirubin oxidase cathode[52]. It is worthy to point out that our system was not optimized for power density in any way. Rather this work was a simple demonstration of power generation using thylakoid membrane and laccase cathode. Further enhancements in current and power densities can be achieved by reducing the anode-cathode separation distance (to lower ohmic impedance), increasing the loading of thylakoids and laccase onto the electrodes (to enhance electro-kinetics) and by managing the mediator diffusion (to minimize mass transfer limitation) for achieving high performance.

Inhibition of Plastocyanin by KCN:

The thylakoid-MWNT composites prepared using KCN in the immobilization mixture exhibited a significant reduction the plastocyanin activity by up to 73%. Although KCN only inhibits plastocyanin, the redox activity of cyt $b_6f$ (peak at 0 V) was also reduced by 23%. This could be due to the lack of an electron acceptor for cyt $b_6f$ (when plastocyanin was inhibited), which may result in an excited cyt $b_6f$ (electron rich) that reacts with oxygen to form peroxides that degrade the cyt $b_6f$ activity over time as suggested by Fuerst et. al. (E. P. Fuerst and M. A. Norman, Interaction of herbicides with photosynthetic electron transport. Weed Science 39, 458-464 (1991)).

Photoactivity of Mediators:

Constant potential measurements on unmodified MWNT electrodes in the presence of mediators at 0.2 V under light on-off conditions showed that the ferricyanide $[Fe(CN)_6]^{3-/4-}$ redox couple exhibited less photo-response than the benzoquinone complexes used by others in the literature. Therefore the observed photocurrent activity in our thylakoid-MWNT composite electrodes can be directly attributed to thylakoids and not the $[Fe(CN)_6]^{3-/4-}$ mediator.

Absorption Spectra of Mediators and Inhibitors:

The peak at 673 nm indicates absorbance via chlorophyll-a. The absorption spectrum for the thylakoid-free MWNT electrode did not contain the chlorophyll peak (FIG. 12A), indicating that the mediator does not compete chlorophyll for absorbing light in the 660-675 nm range. Also the thylakoid-MWNT composite electrode in the presence of mediator showed the 664 nm chlorophyll-a peak, indicating that the light absorbance of chlorophyll was not affected by the presence of mediator. Similar absorption spectra were also obtained for the composite electrodes in the presence of herbicide, DCMU and the inhibitors, KCN and Paraquat/diquat.

Effect of Light Intensity on Photocurrent:

The photo-electrochemical response of the thylakoid-MWNT composite modified electrodes varied with light intensity as shown in FIG. 13. Initially the system was in dark. A high intensity light (80 mW cm$^{-2}$) was illuminated after 60 sec, which resulted in the increase in measured photocurrent at 0.2 V to a stable value of 2.6 $\mu A$. At time 540 s, the light intensity was decreased to "medium" setting in the lamp that resulted in the decrease in photocurrent to 1.9 $\mu A$. When light intensity was further decreased to "low" setting, the photocurrent of the composite further decreased to 0.9 $\mu A$. The results demonstrate very good dependency of thylakoid photo-response on the intensity of the incident light. In these experiments the light passes through the glass cell and buffer solution to reach the electrode, not all the intensity of light was fallen on the electrode surface from the light source.

Advantages of Thylakoid Immobilization:

To understand if there are advantages associated with immobilizing thylakoids for carrying out photo-electrochemical reactions, rather than suspending them in the solution, separate experiments were performed. FIG. 15A reveals that the immobilized thylakoids exhibited a fairly stable and reproducible photo-electrochemical activity over several duty cycles, whereas the thylakoids suspended in solution showed a gradual loss in the photocurrent activity with less reproducibility. Moreover, despite a high concentration of chlorophyll in solution (up to 400 times more), the photocurrents of suspended thylakoids were significantly lower than that of immobilized thylakoids. The electron flux of mediators for immobilized thylakoids would be higher than for suspended thylakoids due to the proximity of thylakoid membrane proteins to the electrode, which reduces the diffusion distance for mediators. It can also be noticed that although high concentration of suspended thylakoids increases the photocurrents, the trend is reversed at exceedingly high thylakoid concentrations due to the issues of high turbidity and low light penetration in the electrolyte, a case that was carefully avoided in the above experiments. The cyclic voltammograms (FIG. 15B) showed redox activities for immobilized thylakoids arising from the direct interaction of surface bound proteins with the electrode. For the case of thylakoids suspended in the solution there was no such redox activity. Therefore some sort of immobilization appears to enhance electron transfer and high photocurrents.

Figures 14A, 14B:
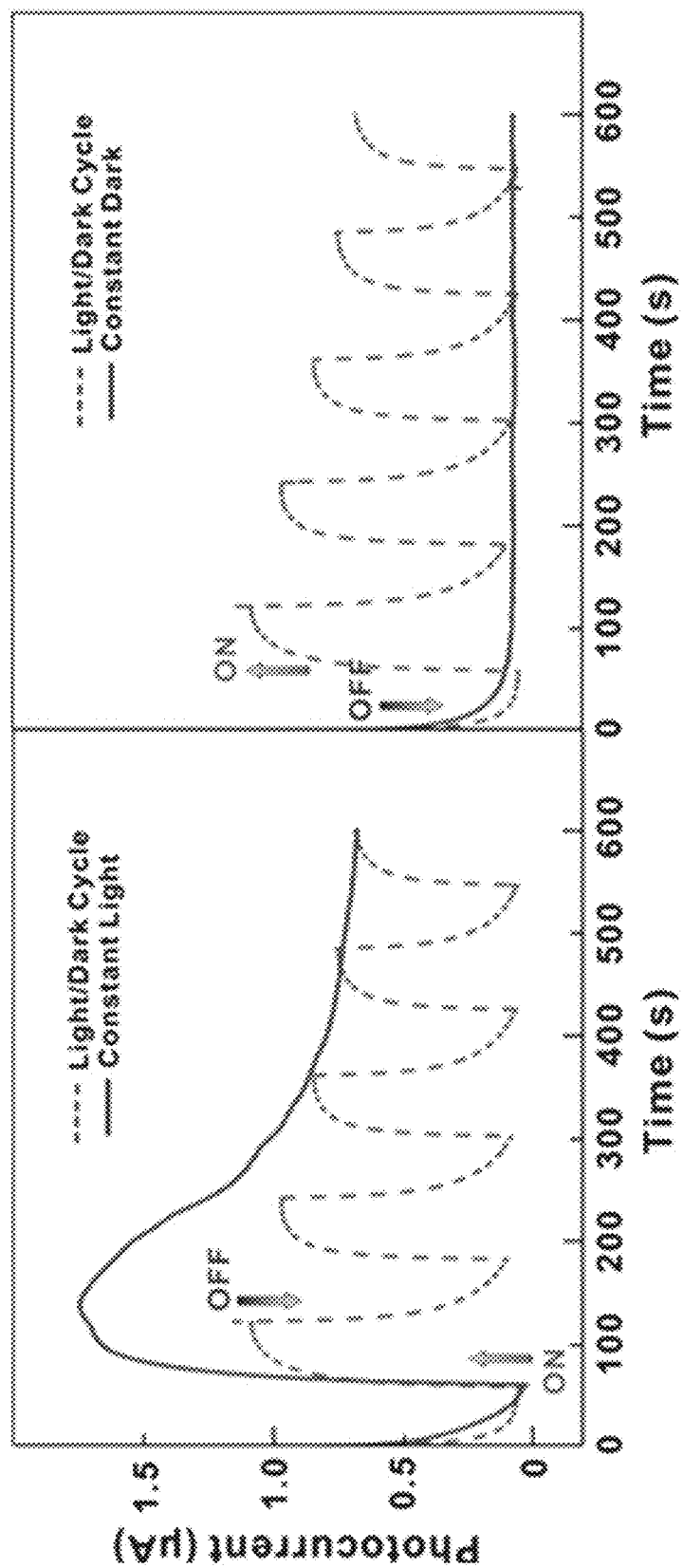
FIGS. 14A-14B illustrate photocurrent analysis of thylakoid-MWNT modified gold electrode under constant light (FIG. 14A) and constant dark (FIG. B) conditions, as compared to light/dark cycle.

Steady State Analysis:

When light was illuminated a large increase in anodic current was observed due to ferrocyanide oxidation at the electrode surface. This would require a continuous ferricyanide reduction by thylakoid membrane proteins in the presence of light. Over time the current generation stabilized to a constant value at approximately 0.675 $\mu A$ (FIG. 14A). This indicates that the observed decrease in photocurrent over time during different light on-off cycles was due to transience in the mediator diffusion, which reaches steady state. The observed phenomenon could partly be due to the establishment of steady diffusion gradients in the system. Initially there was a high concentration of mediator present at the electrode-solution interface. Upon illumination, the redox couple undergoes transition from ferricyanide to ferrocyanide and which results in a decreased concentration of the ferricyanide at the interface. This slows down electron transfer to the electrode until it reaches equilibrium upon which a steady photocurrent was observed. In the absence of light (FIG. 14B), the photocurrent was stabilized to ~1 nA. As we can see from the figures, over time the currents from both experiments reached the same steady value. This suggests that the decrease in the photocurrent over time was partly due to the transience in mediator diffusion. However a loss of photo-electrochemical activity or composite dissolution from the electrode surface over time can neither be verified nor confirmed based on these experimental results.

Figure 16A:
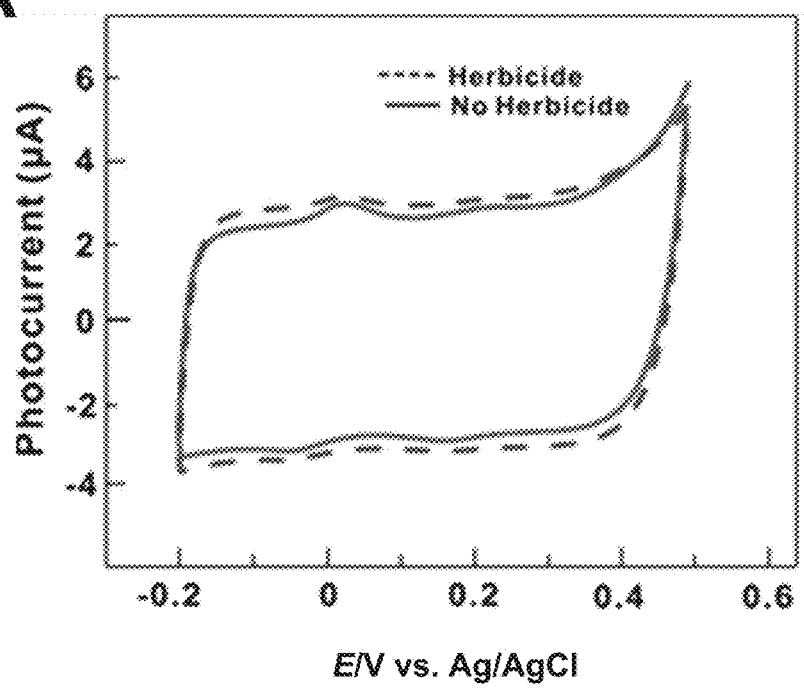
FIG. 16A illustrates cyclic voltammograms of thylakoid-MWNT composites with and without exposure to DCMU herbicide.
Figure 16B:
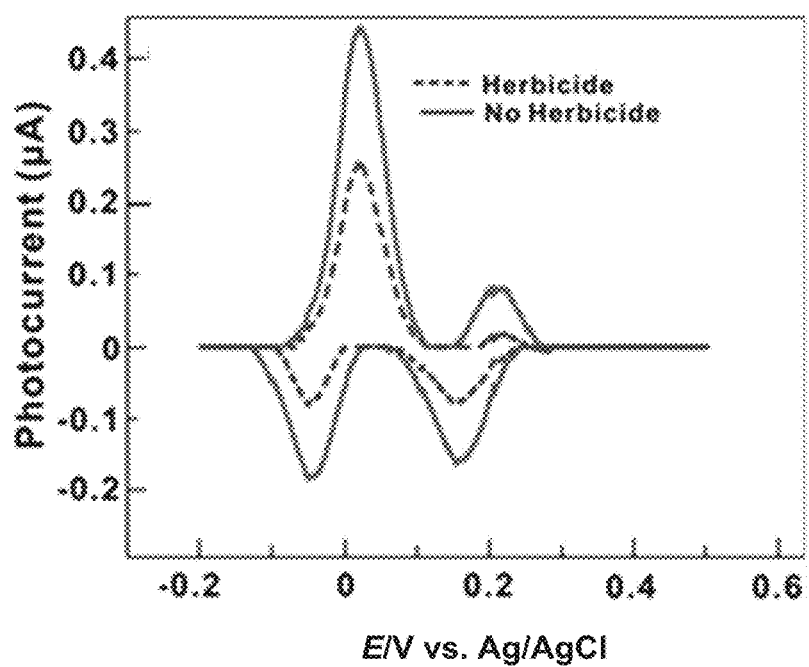
FIG. 16B illustrates background subtracted cyclic voltammograms showing the retention of redox peaks of cyt-$b_6f$ (0 V) and plastocyanin (0.2 V).

Herbicide Inhibition of Photosystem II:

Upon exposing the thylakoid to DCMU herbicide that inhibits PSII activity, no photo-electrochemical activity was noticed in the light on-off tests. However, the cyclic voltammograms under light showed no loss in the redox activities of both cyt-$b_6$f and plastocyanin (FIGS. 16A-16B), indicating the direct electrochemical activity of the thylakoid membrane redox proteins were not affected by the PSII inhibition.

Non-Involvement of PSI in Photocurrent Generation

Figure 17:
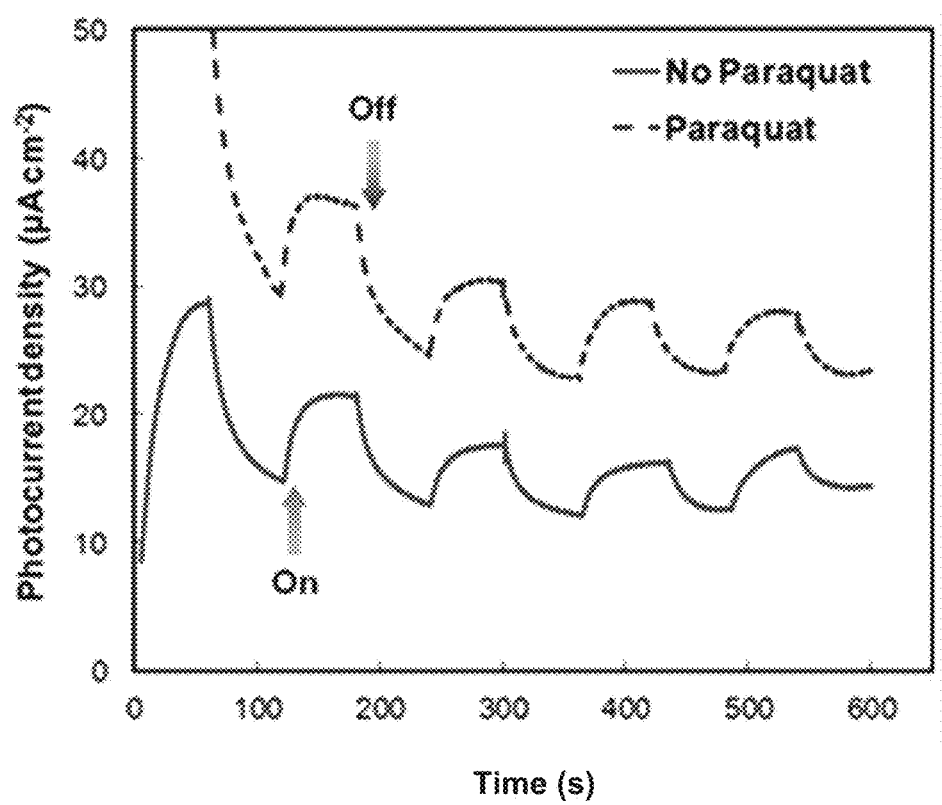
FIG. 17 is a graph illustrating a comparison of the photo-current responses of unexposed and paraquat exposed thylakoid-MWNT composites. ↑ and ↓ represents light on and light off conditions, respectively.

The non-involvement of PSI in photocurrent generation was studied by inhibiting PSI activity by paraquat/diquat solution mixture (of the bipyridillum family). The solution mixture was added to thylakoids prior to immobilization. Paraquat ($E_0$=–0.45 V) acts as a competitor to ferredoxin (FD, $E_0$=–0.51 V) for accepting the electrons from the $F_a/F_b$ site of PSI ($E_0$=–0.56 V) in the photosynthetic pathway. As shown in FIG. 17, the presence of the PSI inhibitor did not significantly reduce the photo-electrochemical response of the thylakoid-MWNT composites. Therefore a portion of the electron flux generated at the OEC site must have been diverted towards the electrode through $[Fe(CN)_6]^{3-/4-}$ mediator as depicted in FIG. 1, rather than to the PSI complex via the natural pathway.

CONCLUSION

The present example demonstrated high photo-electrochemical activity of immobilized thylakoid-MWNT composites for light energy harvesting application. The findings have significant implications for photosynthetic energy conversion and photo fuel production. The composites exhibited direct electron transfer activity, which can be enhanced by using a suitable mediator. Control experiments confirmed that the light-induced water splitting reaction at the PSII complex was the primary source of electrons for photocurrent generation. At least some advantages of using thylakoid membranes as opposed isolated photosystems lie in the self-assembly and utilization of direct electrochemical redox activities of more than one membrane proteins present in the thylakoid. The thylakoid-MWNT composite electrode yielded a maximum current density of 68 µA cm$^{-2}$ and a steady state current density of 38 µA cm$^{-2}$, which are two orders of magnitude higher than the previously reported values in other systems (Table 1). The photo-electrochemical cell delivered a maximum power output of 5.3 µW cm$^{-2}$. No optimization efforts to enhance the power density were attempted in this work. Accordingly, improvements in power densities can be realized by engineering optimization such as, but not limited to, designing suitable membrane-less electrochemical cells, selecting materials for electrode substrates, developing superior immobilization methods etc. Additional understanding of the electron transport pathways will help enhance direct electron transfer and development of a mediator-free system to demonstrate direct light to electricity conversion. The bio-inspired photosynthetic energy conversion technology using plant thylakoids demonstrated in this example offers great potential for green energy harvesting based on a natural process that evolved over millions of years.

References, each of which is incorporated herein by reference.

1 R. E. Blankenship, Molecular Mechanisms of Photosynthesis, Blackwell Science, Oxford, U. K., 2002.
2 R. E. Blankenship, D. M. Tiede, J. Barber, G. W. Brudvig, G. Fleming, M. Ghirardi, M. R. Gunner, W. Junge, D. M. Kramer, A. Melis, T. A. Moore, C. C. Moser, D. G. Nocera, A. J. Nozik, D. R. Ort, W. W. Parson, R. C. Prince and R. T. Sayre, Science, 2001, 332, 805-809.
3 D. Gust, T. A. Moore and A. L. Moore, Acc. Chem. Res., 2001, 34, 40-48.
4 McConnell, G. Li and G. W. Brudvig, Chem. & Biol., 2010, 17, 434-447.
5 I. Listorti, J. Durrant and J. Barber, Nat. Mat., 2009, 8, 929-U922.
6 N. S. Lewis, American Scientist, 1995, 83, 534-541.
7 L. Sun, L. Hammarstrom, B. Akermark and S. Styring, Chem. Soc. Rev., 2001, 30.
8 T. J. Meyer, Acc. Chem. Res., 1989, 22, 163-170.
9 I. J. Iwuchukwu, M. Vaughn, N. Myers, H. O'Neill, P. Frymier and B. D. Bruce, Nat Nano, 2010, 5, 73-79.
10 I. Esper, A. Badura and M. Rögner, Trends in plant science, 2006, 11, 543-549.
11 K. B. Lam, E. F. Irwin, K. E. Healy and L. Lin, Sens. Act. B: Chem., 2006, 117, 480-487.
12 A. Ptak, A. Dudkowiak and D. Frgckowiak, J. Photochem. and Photobiol. A: Chem., 1998, 115, 63-68.
13 M. R. Wasielewski, Chem. Rev., 1992, 92, 435-461.
14 M. R. Wasielewski, Acc. of Chem. Res., 2009, 42, 1910-1921.
15 I. Rybtchinski, L. E. Sinks and M. R. Wasielewski, J. Am. Chem. Soc., 2004, 126, 12268-12269.
16 A. J. Bard and M. A. Fox, Acc. of Chem. Res., 1995, 28, 141-145.
17 R. Bhardwaj, R. L. Pan and E. L. Gross, in Photosynthesis VI. Photosynthesis and Productivity, Photosynthesis and Environment, ed. G. Akoyunoglou, Balaban International Science Services, Philadelphia, 1981, pp. 719-728.
18 R. L. Pan, R. Bhardwaj and E. L. Gross, Photochem. and Photobiol., 1982, 35, 655-664.
19 I. Sanderson, R. Pan and E. Gross, App. Biochem. Biotech., 1983, 8, 395-405.
20 K. B. Lam, E. A. Johnson, M. Chiao and L. Lin, J Microelectromech. S, 2006, 15, 1243-1250.
21 M. Okano, T. Iida, H. Shinohara, H. Kobayashi, and T. Mitamura, Agricultural and Biol. Chem., 1984, 48, 1977-1983.
22 R. Carpentier and M. Mimeault, Biotech. Lett., 1987, 9, 111-116.
23 S. Lemieux and R. Carpentier, J. Photochem. and Photobiol. B: Biol., 1988, 2, 221-231.
24 I. Y. Katz, A. Y. Shkuropatov and V. A. Shuvalov, J. Electroanal. Chem. and Interfacial Electrochem., 1990, 298, 239-247.
25 K. Abe, A. Ishii, M. Hirano and J. F. Rusling, Electroanal., 2005, 17, 2266-2272.
26 A. Badura, D. Guschin, B. Esper, T. Kothe, S. Neugebauer, W. Schuhmann and M. Rögner, Electroanal., 2008, 20, 1043-1047.
27 R. Das, P. J. Kiley, M. Segal, J. Norville, A. A. Yu, L. Wang, S. A. Trammell, L. E. Reddick, R. Kumar, F. Stellacci, N. Lebedev, J. Schnur, B. D. Bruce, S. Zhang and M. Baldo, Nano Lett., 2004, 4, 1079-1083.
28 I. Katz, A. Y. Shkuropatov and V. A. Shuvalov, Bioelectrochem. Bioenerg., 1990, 23, 239-247.

29 S. Tsujimuraa, A. Wadanob, K. Kanoa and T. Ikedaa, Enzyme and Microbial Tech., 2001, 29, 225-231.
30 A. J. McCormick, P. Bombelli, A. M. Scott, A. J. Philips, A. G. Smith, A. C. Fisher and C. J. Howe, Energy Environ. Sci., 2011, 4, 4699-4709.
31 M.-H. Ham, J. H. Choi, A. A. Boghossian, E. S. Jeng, R. A. Graff, D. A. Heller, A. C. Chang, A. Mattis, T. H. Bayburt, Y. V. Grinkova, A. S. Zeiger, K. J. V. Vliet, E. K. Hobbie, S. G. Sligar, C. A. Wraight and M. S. Strano, Nat. Chem., 2010, 2, 929-936.
32 M. Vittadello, M. Y. Gorbunov, D. T. Mastrogiovanni, L. S. Wielunski, E. L. Garfunkel, F. Guerrero, D. Kirilovsky, M. Sugiura, A. W. Rutherford, A. Safari and P. G. Falkowski ChemSusChem, 2010, 3, 471-475.
33 J. Barber, Quarterly Rev. Of Biophy., 2003, 36, 71-89.
34 N. Lebedev, S. A. Trammell, A. Spano, E. Lukashev, I. Griva and J. Schnur, J. Am. Chem. Soc., 2006, 128, 12044-12045.
35 T. Noji, H. Suzuki, T. Gotoh, M. Iwai, M. Ikeuchi, T. Tomo and T. Noguchi, J. Phy. Chem. Lett., 2011, 2, 2448-2452.
36 I. Ulas and G. W. Brudvig, J. Am. Chem. Soc., 2011, 133, 13260-13263.
37 E. Fuhrmann, S. Gathmann, E. Rupprecht, J. Golecki and D. Schneider, Plant Physiol., 2009, 149, 735-744.
38 C. F. Meunier, P. Van Cutsem, Y.-U. Kwon and B.-L. Su, J. Mat. Chem., 2009, 19, 1535-1542.
39 R. Carpentier, Photosynthesis Research Protocols, Humana Press, Totowa, N.J, 2004.
40 R. P. Ramasamy, H. R. Luckarift, D. M. Ivnitski, P. B. Atanassov and G. R. Johnson, Chem. Comm., 2010, 46, 6045-6047.
41 N. S. Parimi, Y. Umasankar, P. Atanassov and R. P. Ramasamy, ACS Cat., 2012, 2, 38-44.
42 C. Lau, E. R. Adkins, R. P. Ramasamy, H. R. Luckarift, G. R. Johnson and P. Atanassov, Adv. Energy Mat., 2012, 2, 162-168.
43 I. A. Semenova, J. Plant Physiol., 2002, 159, 613-625.
44 M. Salin, Physiol. Plant, 1987, 72, 439.
45 K. B. Lam, Johnson, E. A., Chiao, M., Lin, L., J. Microelectromechanical Sys., 2006, 15, 1243-1250.
46 P. N. Bartlett, Bioelectrochemistry Fundamentals, Experimental Techniques and Applications, John Wiley & Sons, Ltd, U K, 2008.
47 M. Richard and J. A. Pedro, Biochem. Bioph. Res. Co., 1975, 63, 1157-1160.
48 D. G. Sanderson, L. B. Anderson and E. L. Gross, Biochim. Biophys. Acta, 1986, 852, 269-278.
49 R. Ouitrakul and S. Izawa, Biochim. et Biophy. Acta (BBA)—Bioenergetics, 1973, 305, 105-118.
50 Y. Abdollahi, A. H. Abdullah, U. I. Gaya, S. Ahmadzadeh, A. Zakaria, K. Shameli, Z. Zainal, H. Jahangirian and N. A. Yusof, J. Brazilian Chem. Soc., 2012, 23, 236-240.
51 V. Ivanov and S. Lyashkevich, High Energy Chem., 2011, 45, 210-213.
52 O. Yehezkeli, R. Tel-Vered, J. Wasserman, A. Trifonov, D. Michaeli, R. Nechushtai and I. Willner, Nat. Comm., 2012, 3, 742.
53 N. Terasaki, M. Iwai, N. Yamamoto, T. Hiraga, S. Yamada and Y. Inoue, Thin Solid Films, 2008, 516, 2553-2557.
54 V. Bhalla and V. Zazubovich, Anal. Chim. Acta, 2011, 707, 184-190.
55 A. Badura, B. Esper, K. Ataka, C. Grunwald, C. Wöll, J. Kuhlmann, J. Heberle and M. Rögner, Photochem. and Photobiol., 2006, 82, 1385-1390.
56 S. B. Powles, Ann. Rev. of Plant Physiology, 1984, 35, 15-44.
57 P. Sarvikas, M. Hakala-Yatkin, S. Donmez and E. Tyystjarvi, J. Exp. Bot., 2010, 61, 4239-4247.
58 I. Baroli and A. Melis, Planta, 1996, 198, 640-646.
59 L. N. M. Duysens, Biophys. J., 1972, 12, 858-863.
60 J. Ahmed, W. Park and S. Kim, Bull. Korean Chem. Soc., 2009, 30, 2195-2196.
61 K. B. Lam, E. A. Johnson, M. Chiao and L. Lin, J. Microelectromech. Sys., 2006, 15, 1243-1250.
62 S. A. Trammell, A. Spano, R. Price and N. Lebedev, Biosens. Bioelect., 2006, 21, 1023-1028.

Example 2

Photosynthetic Energy Conversion Using Photosynthetic Bacteria Composites

In the present example, electrochemical cells were designed and tested similar to those described in Example 1, above, except in place of thylakoids, photosynthetic bacterial organism were complexed with carbon nanotubes to provide photosynthetic energy conversion.

Materials and Methods:

Materials and methods are similar to those described in Example 1 above, except as noted below. Sterile cultures of *Nostoc* sp. and AV were obtained from Bioconversion Research Centre, UGA and cultured in our laboratory in shake flasks using BG11 medium under 12 hr light/dark cycles. Once the optical density at 750 nm ($OD_{750}$) reaches around 1 (happens ~15 after the culture inoculation), the culture was harvested by centrifuging at 5000 rpm for 10 min at room temperature and washed in phosphate buffer (0.1 M, pH 7) before used for immobilization onto the electrode. 5 μl of multi-walled carbon nanotubes suspension (1 mg/ml in DMF) was dropped on the carbon paper and allowed to dry. 5 μl of the washed bacterial cells were immobilized on the top of carbon nanotube layer, allowed to air dry. The resulting bacterial cell modified carbon nanotube electrode was then used for the photo-electrochemical experiments.

Figure 18:
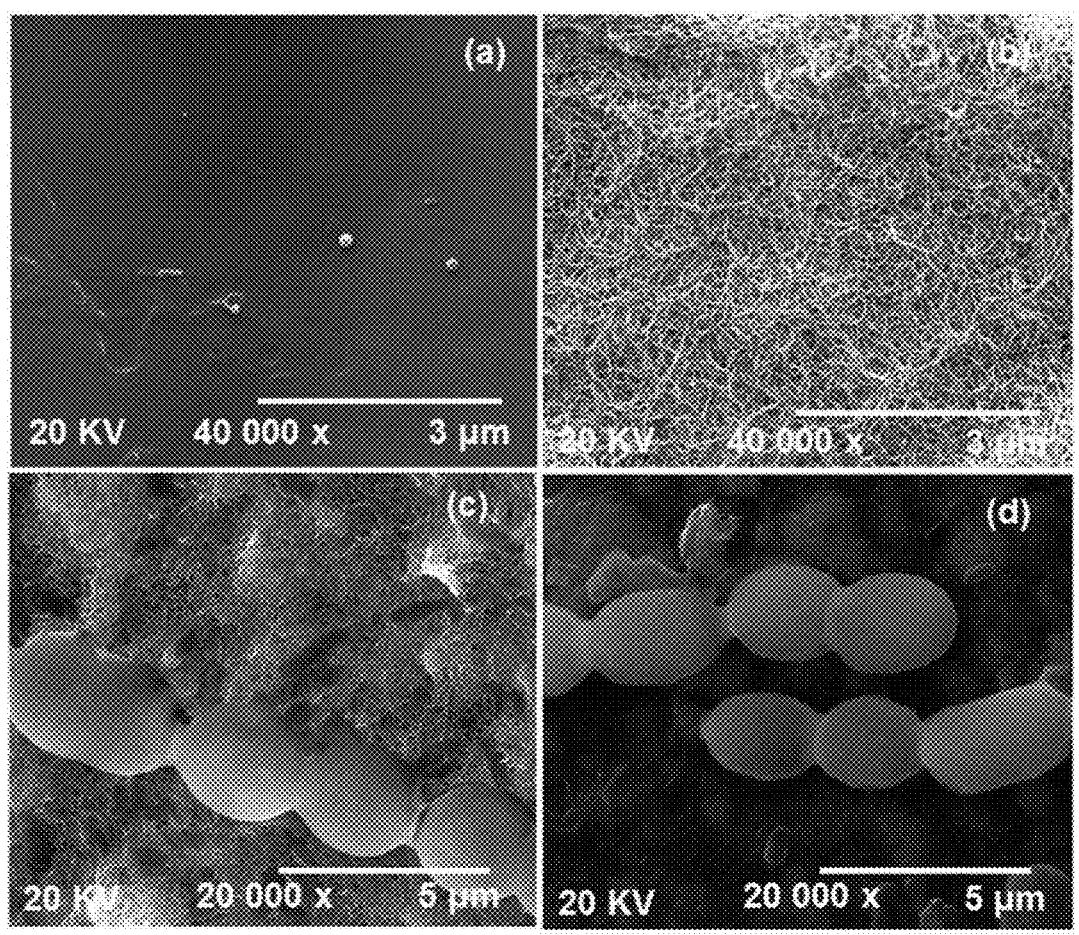
FIG. 18 is a group of scanning Electron Microscopic images: (a) carbon paper, (b) carbon paper with MWCNT (CP-MWCNT), (c) *Anabaena variabilis* immobilized on CP-MWCNT and (d) *Nostoc* sp. immobilized on CP-MWCNT.

Results and Discussion:

The morphology of the immobilized *Nostoc* sp. and *Anabaena variabilis* (AV) on the multi-walled carbon nanotubes (MWNT) were studied by scanning electron microscopy (SEM). FIGS. 18A-18D shows the SEM images of carbon paper, MWNT on carbon paper, *Nostoc* sp. on MWNT, and AV on MWNT. FIG. 18B shows well dispersed MWNT uniformly deposited on the carbon paper surface forming a mesh like matrix. The filaments of the *Nostoc* sp. and AV can be seen in FIGS. 18C and 19D. However, careful analysis of the images reveals that the sheath wrapping the photosynthetic bacteria has good interaction with the MWNT (edges touching the MWNT in FIG. 18C). In *Nostoc* sp. the interaction of sheath with the MWNT was much higher than at AV. This interaction of *Nostoc* sp. with the MWNT could possibly facilitate higher electron transfer from the electron transport pathway to the MWNT compared to AV. Electrochemical experiments were given in the following to verify this hypothesis.

Figure 19A:
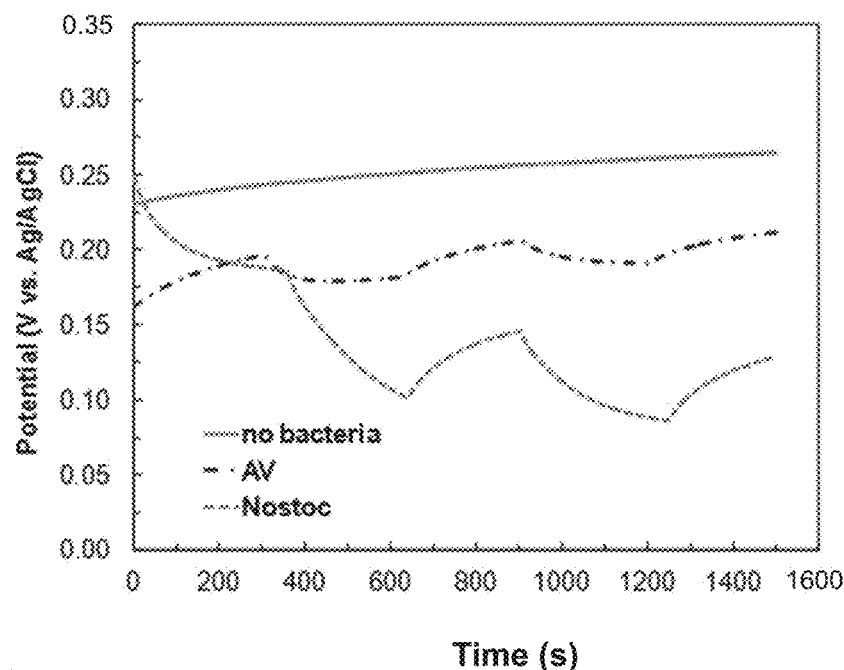
FIG. 19A is a graph illustrating measurement of open circuit potential comparing bare and PS bacteria-modified CP-MWCNT electrodes, and the graph in FIG. 19B illustrates photocurrent density of bare and PS bacteria modified CP-MWCNT.

In general, the value of open circuit potential (OCP) is dictated by the mixed potential caused by a variety of electron transfer reactions whose individual redox potentials range from −1.3 to 1.0 V vs. SHE. FIG. 19A compares the open circuit potentials (OCP) of *Nostoc* sp., AV and in the absence of bacteria (i.e., MWNT electrode). During the course of the experiments, dark and light conditions (light on-off cycle) were varied alternatively with an interval of 300 s. During the light on-off cycle, the potential of *Nostoc* sp. and AV modified electrodes showed stepwise variation indicating photo-electrochemical activity by these organisms. The potential variation between light on-off cycles was as high as 100 mV for *Nostoc* sp. and 30 mV for AV. In the absence of bacteria the electrode showed an OCP of about 0.25 V, and the OCP was constant throughout the light on-off cycle indicating that there was no photo-electrochemical activity on the bare MWNT modified carbon paper (CP) electrode.

Figure 19B:
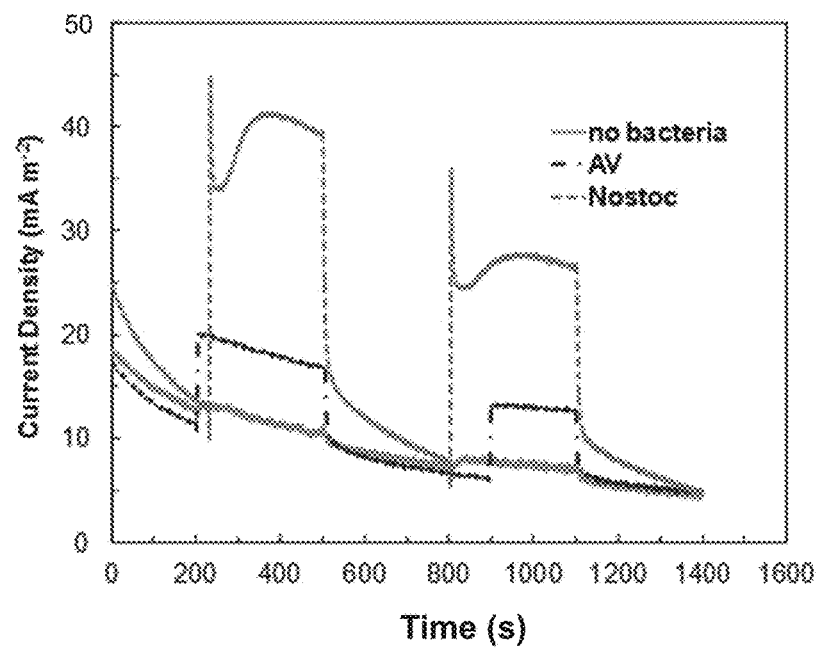

The photo-activity of the photosynthetic bacteria modified electrodes were evaluated at constant working electrode potential of 0.2 V and the corresponding photo-current response was measured over time during light on-off cycles. FIG. 19B shows the steady state photocurrent density obtained from the photosynthetic activity of both *Nostoc* sp. and AV. This increase in current density during light-on clearly indicates the transfer of electrons from the photosynthetic bacteria to the MWNT and eventually to the electrode surface. The natural electron transport pathway of the linear photosynthetic process starts with water oxidation at the oxygen evolving complex (OEC) site of the PSII complex. The electrons are then transferred from here to the PSI complex through plastoquinone, cytochrome $(Cyt)b_{6f}$ and plastocyanin respectively. In this pathway, before the electron reaches PSI, any redox protein except PSII can transfer electrons to the MWNT, and thus, to the electrode. The maximum photocurrent density was 35 mA m$^{-2}$ for the *Nostoc* sp. modified electrode, and 10 mA m$^{-2}$ for the AV modified electrode.

Figure 20:
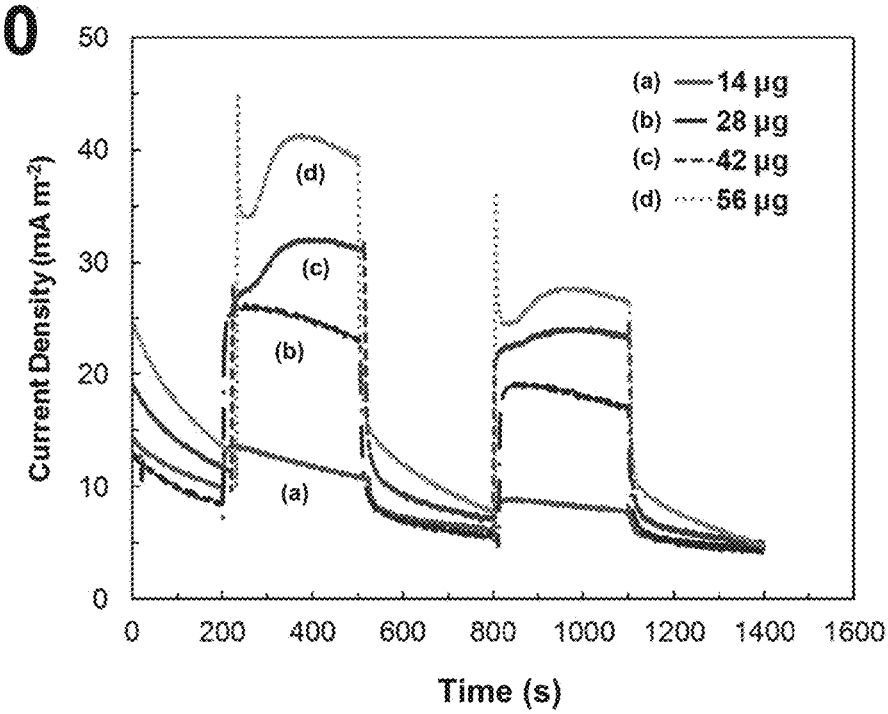
FIG. 20 is a graph illustrating dependency of photocurrent generation on *Nostoc* sp. loading on the CP-MWCNT electrode.

The current vs. time plots of fixed anode potentials were used as a tool for optimizing the photosynthetic bacteria loading on the electrode surface. The results showed that the photocurrent density was directly proportional to *Nostoc* sp. loading (FIG. 20). The maximum loading achieved on the CP-MWCNT electrode during this test was 56 μg. However, higher loadings could be achieved by modifying the morphology and physical properties of the MWCNT coating on the CP electrode.

Figure 21:
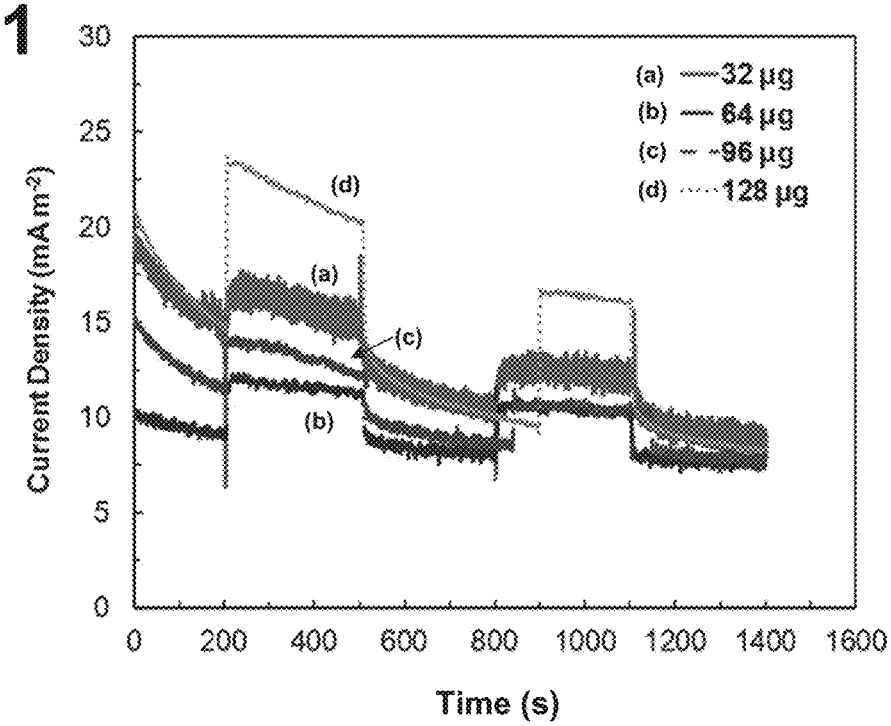
FIG. 21 is a graph illustrating dependency of photocurrent generation on AV loading on the CP-MWCNT electrode.

In the case of AV (FIG. 21), a maximum loading of 128 μg was achieved. Comparison of *Nostoc* sp. and AV results reveals that *Nostoc* sp. Appears to possess higher photoelectrochemical activity than AV under the conditions tested. Since *Nostoc* sp. performed better among the two organisms studied, it was selected for detailed characterization studies.

Figure 22:
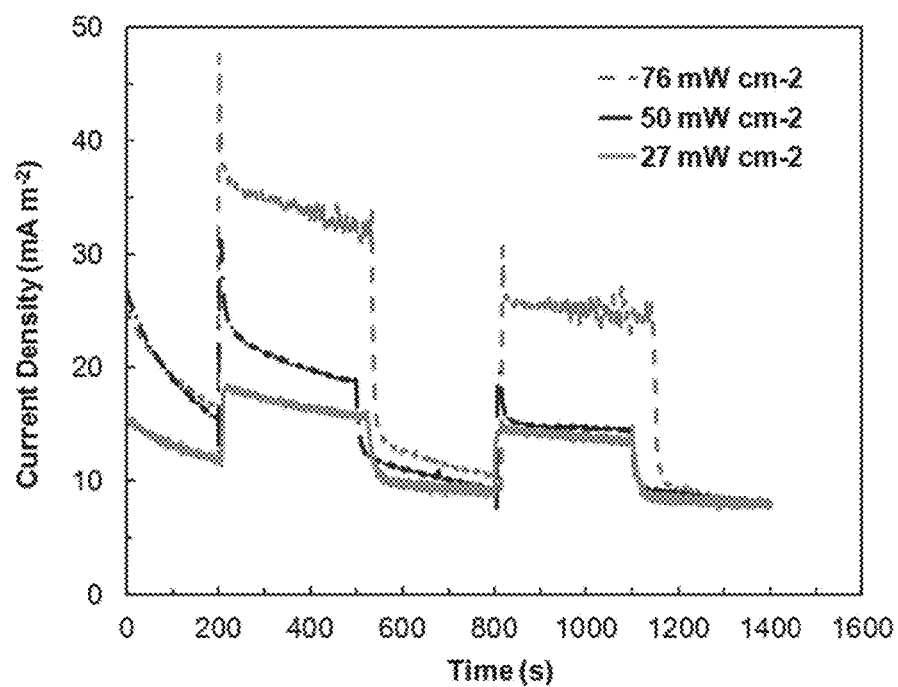
FIG. 22 is a graph illustrating photocurrent generation in *Nostoc* sp. illuminated with white light of varying intensities.

The photo-electrochemical response of the *Nostoc* sp. varied with incident light intensity as shown in FIG. 22. Higher illumination resulted in higher photocurrent density, in the order of 27<50<76 mW cm$^{-2}$. The results demonstrate the dependency of *Nostoc* sp. photo-response on the intensity of the incident light. It should be noted that in the experimental set up for this example, only a small fraction of the incident light actually fell onto the electrode. This is because the electrode was kept in a hanging position inside a glass electrochemical cell containing the buffer solution and there was no attempt made to funnel the light to the electrode surface.

Figure 23:
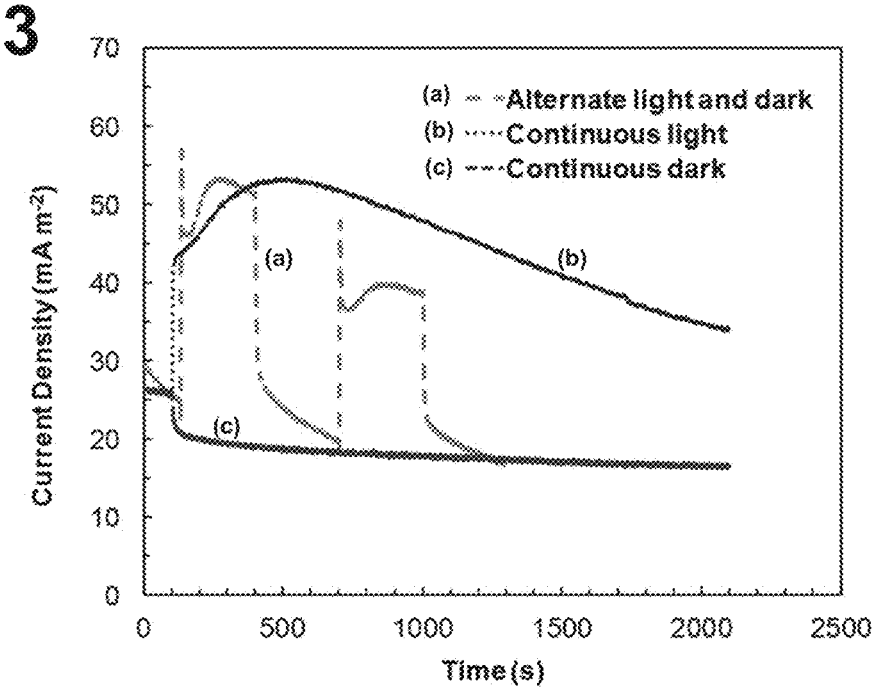
FIG. 23 is a graph illustrating the stability of photocurrent generation in *Nostoc* sp. under continuous light and dark and alternate light/dark phases.

The stability of current generation was studied by observing the steady state current change during the experiments. To identify the steady state, currents were measured in continuous light and dark conditions without cycling. FIG. 23 shows the overlay of light on-off cycle results with that of steady state studies at continuous light and continuous dark conditions. As seen in FIG. 23, over time, the currents from both experiments reached the same steady value. The steady state photocurrent density for *Nostoc* sp. was 10 mA m$^{-2}$.

Figure 24A:
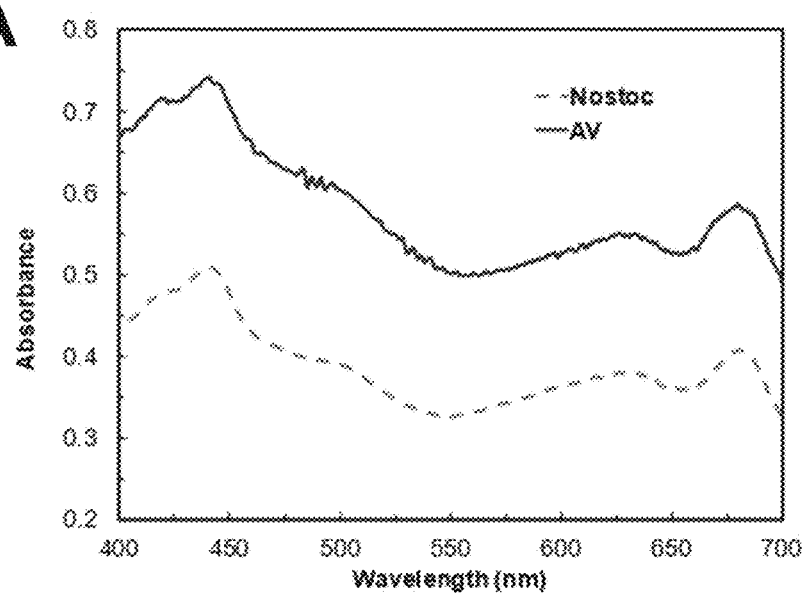
Figure 24B:
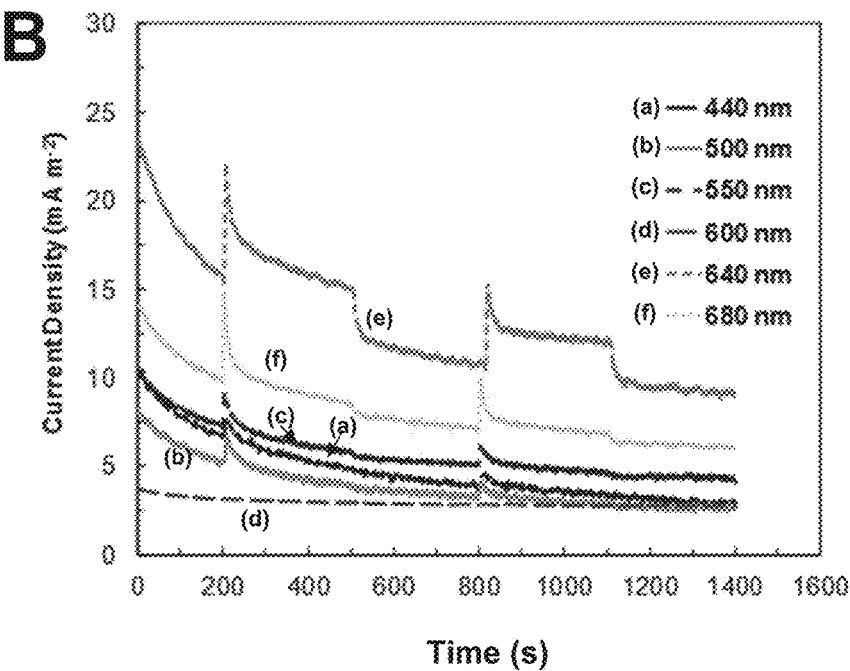

The major pigment present in all known photosynthetic organisms is chlorophyll a, which forms the reaction centers in both PSII (P680) and PSI (P700), absorbing light efficiently at 465 nm and 665 nm. Additionally, cyanobacteria such as AV and *Nostoc* also possess certain accessory pigments such as phycocyanin, phycoerythrin and carotenoids that maximize the range of action spectrum by absorbing a range of wavelengths other than that absorbed by Chlorophyll a (Chl a). Upon absorbing the characteristic light, these accessory pigments transfer the absorbed energy to other pigments and finally to the reaction center Chl a. FIG. 24A shows the action spectrum in the visible region for *Nostoc* sp. and AV, containing distinctive peaks corresponding to absorbance for Chl a, phycocyanin, and phycoerythrin. Various insights can be achieved by analyzing the generation of photocurrent in *Nostoc* sp. by illuminating with lights of different characteristic wavelengths, so that the contribution of different pigments towards photocurrent generation can be studied. Experiments have been conducted using lights of 440, 500, 550, 600, 640 and 680 nm wavelengths as shown in FIG. 24B. It has been found that *Nostoc* sp. illuminated using 640 nm light (corresponding to phycocyanin) resulted in maximum photocurrent.

Figure 25:
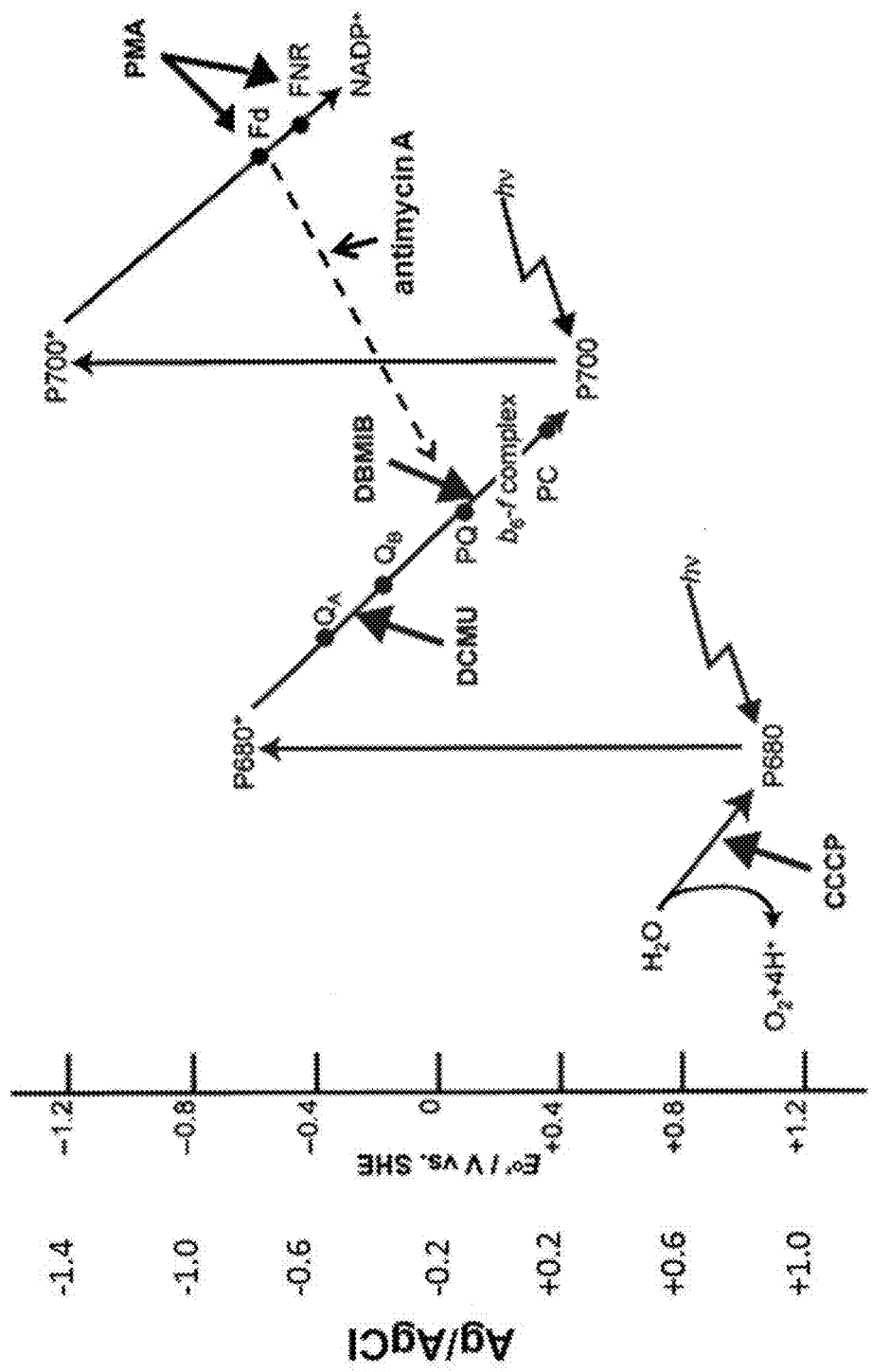
FIG. 25 illustrates the photosynthetic electron transport chain and blocking sites of various inhibitors.

The mechanism of electron transfer from the photosynthetic electron transfer chain (PETC) to the MWCNT was also studied with the help of photosystem inhibitors. Inhibitors such as DCMU ((3-(3,4-dichlorophenyl)-1,1-dimethylurea), DBMIB (2,5-dibromo-3-methyl-6-isopropylbenzoquinone), KCN (potassium cyanide) and antimycin-A specifically block a particular site of the electron transfer chain (FIG. 25). DCMU binds at $Q_B$ site of PSII and inhibit the electron transfer downstream of PSII. DBMIB is an analogue of PQ (plastoquinone) and binds at the $Q_O$ site of cytochrome b$_6$f complex, arresting the electron flow beyond that complex. KCN has been found to replace the copper ion of plastocyanin (PC), thereby preventing the electron flow from Cyt b$_6$f to PSI. Antimycin-A blocks the electron transfer from ferredoxin to PQ, disrupting the cyclic electron transfer around PSI. All these inhibitors are highly site-specific and have been used in the photosynthesis research to decipher the source of electron channeling from the photosynthetic machinery.

Figure 26A:
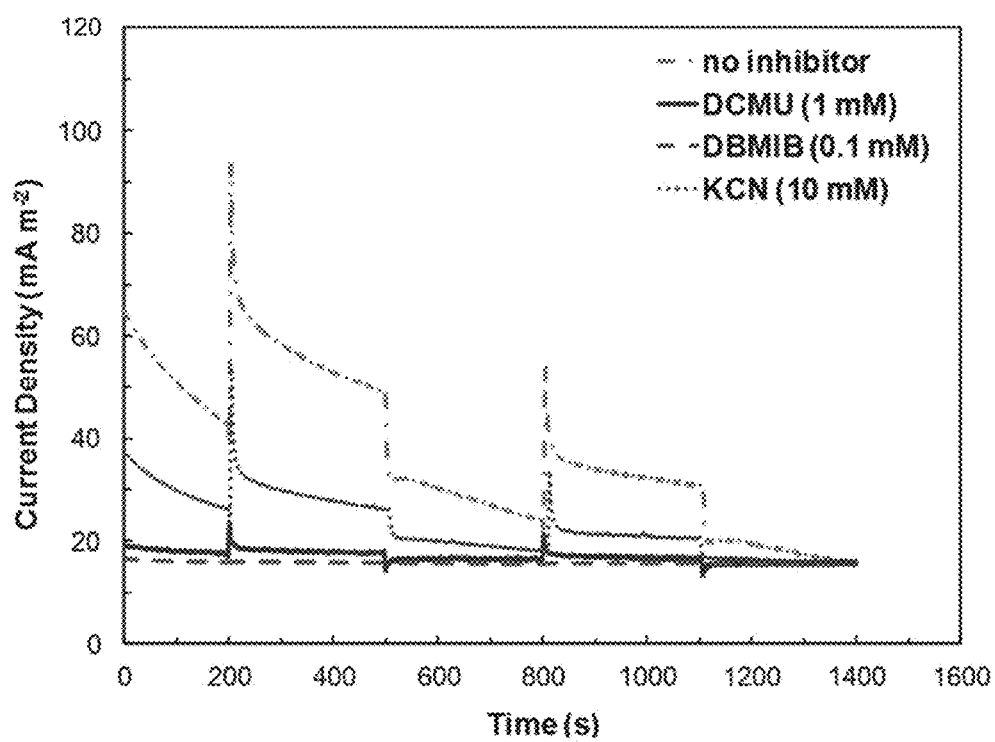
FIG. 26A is a graph illustrating the effect of various inhibitors of photosynthetic electron transport chain on photocurrent generation in *Nostoc* sp.
Figure 26B:
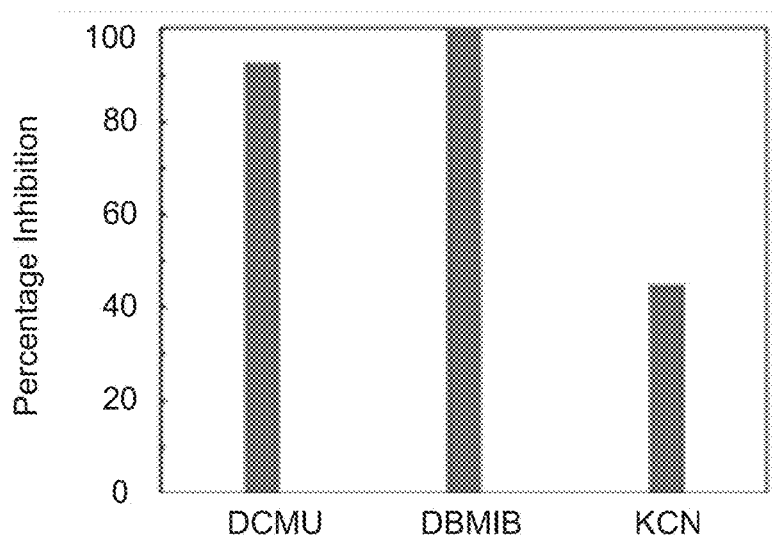
FIG. 26B is a bar graph showing the percentage inhibition of each inhibitor (DCMU, DBMIB, and KCM)
Figure 27A:
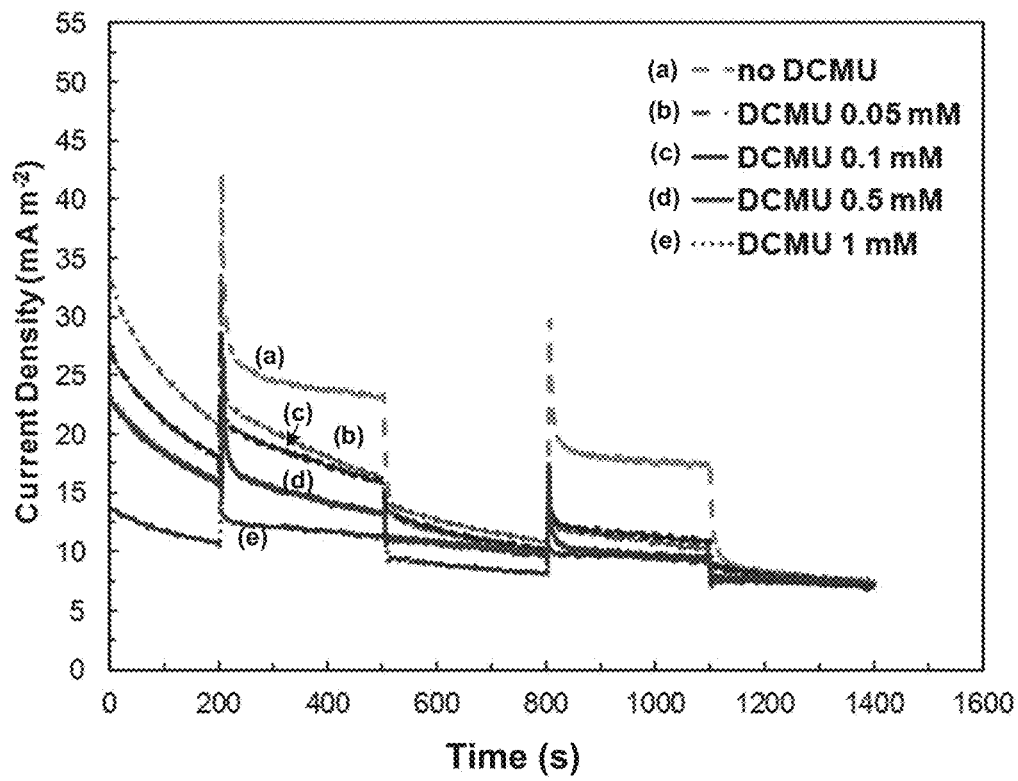
FIG. 27A illustrates the effect of varying concentration of DCMU on photocurrent generation in *Nostoc* sp.
Figure 27B:
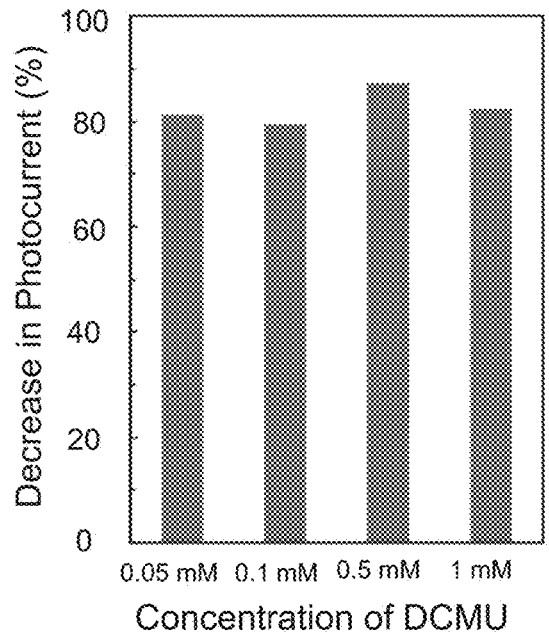
FIG. 27B is a bar graph illustrating the decrease in percentage photocurrent as a function of concentration of DCMU.

Experiments were conducted to measure the photocurrent produced by the *Nostoc* sp. after incubating the cells with the inhibitors such as DCMU, DBMIB and KCN at varying concentrations, and the results have been summarized in FIG. 26. DCMU was found to inhibit the photocurrent by around 80% compared to that of wild type as shown in FIG. 27, indicating that the primary source of photocurrent is the electron from oxidation of water by PSII. The remaining 20% photocurrent could be attributed to either lack of complete inhibition by DCMU at the $Q_B$ site of PSII, or the electron could have come from possible sources other than PSII.

Figure 28:
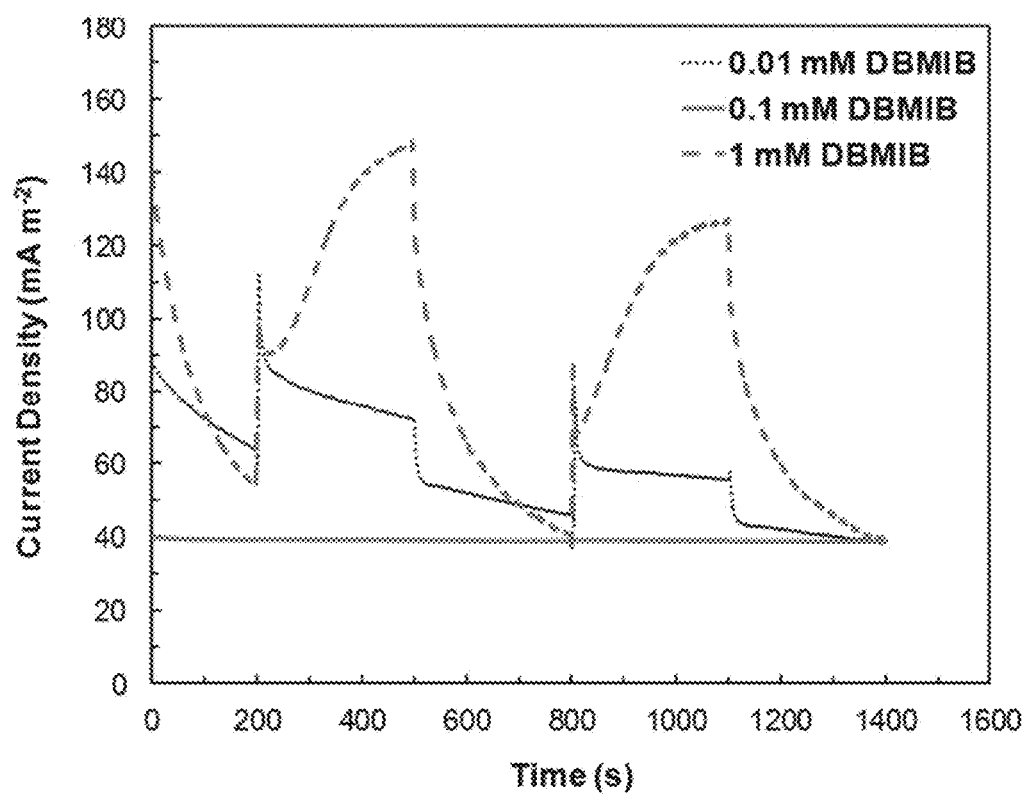
FIG. 28 illustrates the effect of varying concentration of DBMIB on photocurrent generation in *Nostoc* sp.

The inhibition by DBMIB is highly dependent on the concentration of the DBMIB used as illustrated in FIG. 28. At a concentration of 0.1 mM, DBMIB inhibits the photocurrent completely, whereas upon increasing the concentration to 1 mM, the generation of photocurrent is enhanced significantly compared to that without inhibitor. It has also been observed that a low concentration of 0.01 mM DBMIB is not sufficient enough to arrest the electron flow at Cyt b$_6$f complex. Due to the complete reduction in photocurrent at 0.1 mM DBMIB, it is believed that the Cyt b$_6$f is the site in PETC through which the electrons reach the electrode via MWCNT generating photocurrent.

Figure 29A:
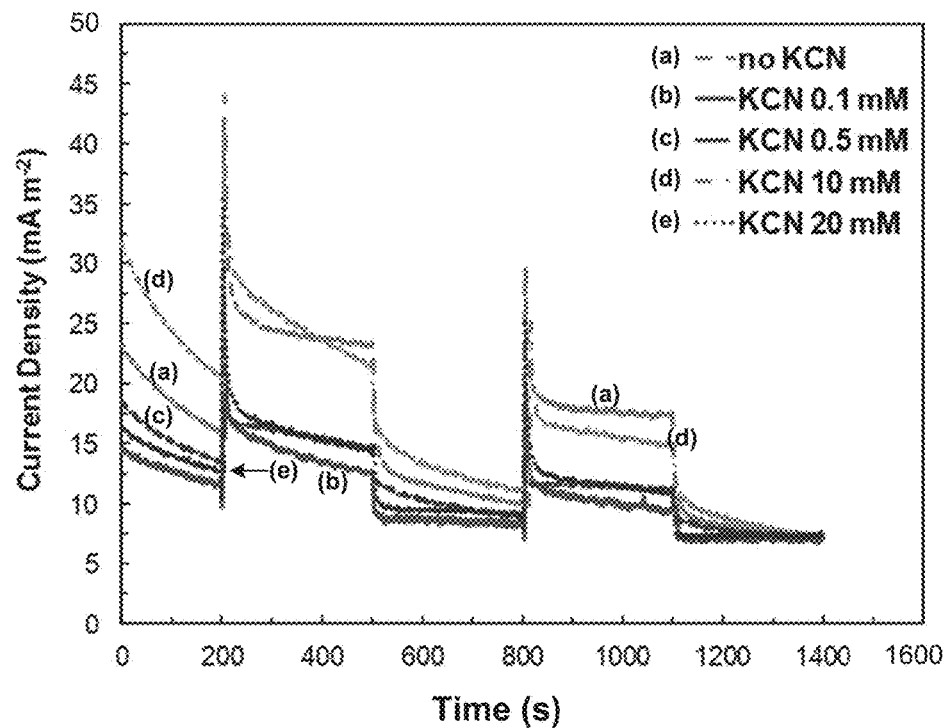
FIG. 29A illustrates the effect of varying concentration of KCN on photocurrent generation in *Nostoc* sp.
Figure 29B:
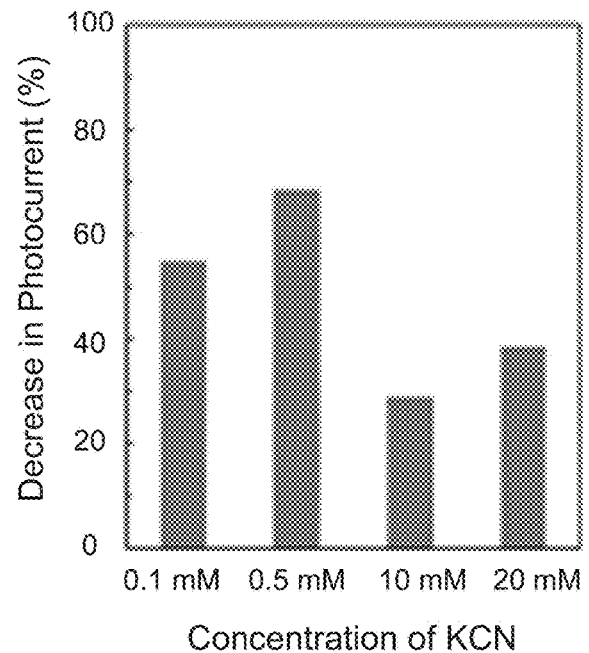
FIG. 29B is a bar graph illustrating the decrease in percentage photocurrent as a function of concentration of KCN.

Inhibition of photocurrent by KCN is considerable (FIG. 29) with nearly 50% reduction in photocurrent compared to the wild type. If the major detour of electron towards the electrode is through Cyt $b_6f$, the inhibitors downstream of it should not diminish the photocurrent. However, it is not so in the case of KCN, which indicates that, the total photocurrent has not exclusively been arising from the electron leaving Cyt $b_6f$ site. Rather, an alternate pathway could be involved in contributing to the photocurrent. The cyclic electron transport (CET) around PSI can be one other contributing factor for the total photocurrent. Experiments with chemicals inhibiting the CET such as antimycin A will be helpful to analyze contribution of cyclic electron transport to the generation of photocurrent.

The Q cycle catalyzed by $Q_o$ and $Q_i$ sites of Cyt $b_6f$ complex represent another possible source for the photocurrent. The two electrons coming from the oxidation of $PQH_2$ at $Q_o$ site of Cyt $b_6f$ complex are not completely transferred to PC; rather only one electron is transferred through Cyt f to PC, and the other electron is used to reduce PQ at $Q_i$ site through atypical heme x (Zhang et al, 2004; Stroebel et al, 2003). It has been investigated that this heme x near the $Q_i$ site functions as a redox wire allowing ferredoxin or other electron carrier to reduce PQ pool.

The foregoing examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in atmospheres. Standard temperature and pressure are defined as 25° C. and 1 atmosphere.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to measurement techniques and the numerical value. In addition, the phrase "about 'x' to 'y'" includes "about 'x' to about 'y'".

Many variations and modifications may be made to the embodiments described in the preceding Examples. All such modifications and variations are intended to be included herein within the scope of this disclosure and protected by the following claims.

I claim:

1. A photosynthetic electrochemical cell comprising:
an anode composite comprising an anode, a matrix of nanostructured materials coupled to the anode, and at least one photosynthetic microorganism coupled to the anode via the matrix of nanostructured material in electrochemical communication with the photosynthetic microorganism, such that the photosynthetic microorganism is coupled to the matrix of nanostructured material and the matrix of nanostructured material is located between the anode and the photosynthetic microorganism, wherein the photosynthetic microorganism is capable of oxidizing water molecules and generating electrons using light induced photo-electrochemical reactions and wherein the anode composite is configured such that at least some electrons generated by the photosynthetic organism are conducted to the anode via direct electron transfer; and
a cathode composite comprising a cathode and at least one enzyme or metallic catalyst capable of reducing $O_2$.

2. The photosynthetic electrochemical cell of claim 1, wherein the photosynthetic organism comprises one or more photosynthetic organisms selected from the group of photosynthetic organisms consisting of: cyanobacteria, green sulfur bacteria, algae, *spirulina, chlorella*, and combinations thereof.

3. The photosynthetic electrochemical cell of claim 2, wherein the photosynthetic organism is selected from the group consisting of: *Nostoc* sp., *Anabaena variabilis, Synechococcus* sp., *Spirulina* sp., *Rhobacter* sp., *Rhodobium* sp., *Chlorobium* sp., and combinations thereof.

4. The photosynthetic electrochemical cell of claim 1, wherein the matrix of nanostructured materials is selected from the group of nanostructured materials consisting of: carbon nanotubes, multi-walled carbon nanotubes, fullerenes, carbon nanoparticles, graphenes, two-dimensional carbon nanosheets, graphite platelets, other carbon nanostructured materials, metallic nanoparticles, semiconductor nanoparticles, quantum dots, and combinations of these materials.

5. The photosynthetic electrochemical cell of claim 1, wherein the photosynthetic organism includes at least two the following photosynthetic compounds: PSII, plastoquinone, cyt $b_6f$, plastocyanin, and PSI.

6. The photosynthetic electrochemical cell of claim 5, wherein the photosynthetic organism further includes one or more of the following photosynthetic compounds: phycocyanin, phycoerythrin, and a carotenoid compound.

7. The photosynthetic electrochemical cell of claim 1, wherein the photosynthetic organism is coupled to the matrix of nanostructured material by a linking agent selected from the group consisting of: 1-pyrenebutanoic acid succinimidyl ester (PBSE), a protein homo-bifunctional cross-linking agent, a hetero-bifunctional cross-linking agents, and a combination thereof.

8. The photosynthetic electrochemical cell of claim 1, wherein the at least one enzyme capable of reducing $O_2$ is selected from the group consisting of: laccase, bilirubin oxidase, ascorbate oxidase, tyrosinase, catechol oxidase, and a combination thereof.

9. The photosynthetic electrochemical cell of claim 1, further comprising a redox mediator selected from the group consisting of: ferricyanide, a quinone based compound, an osmium complex based compound, a redox chemical compound, and a combination thereof.

10. A method of generating an electrical current comprising:
providing an electrochemical cell comprising:
an anode composite comprising an anode and at least one photosynthetic microorganism coupled to the anode via a matrix of nanostructured material coupled to the anode and in electrochemical communication with the photosynthetic microorganism such that the photosynthetic microorganism is coupled to the matrix of nanostructured material and the matrix of nanostructured material is located between the anode and the photosynthetic microorganism, and wherein the anode composite is configured such that at least some electrons generated by the photosynthetic organism are conducted to the anode via direct electron transport, and a cathode composite capable of reducing $O_2$; and exposing the electrochemical cell to light in the presence of water, wherein the photosynthetic microorganism uses light energy to oxidize a water molecule and generate electrons, which are transferred to the anode via the nanostructured material, and wherein electrons generated at the anode reduce $O_2$ at a cathode, thereby inducing a potential difference between the anode and the cathode and generating an electrical current.

11. The method of claim 10, wherein the photosynthetic microorganism comprises PSII and at least one photosynthetic compound selected from the group consisting of: PSI, plastoquinone, cyt $b_6f$, plastocyanin, phycocyanin, phycoerythrin, a carotenoid compound, and combinations thereof.

12. The method of claim 10, wherein the matrix of nanostructured materials is selected from the group of nanostructured materials consisting of: carbon nanotubes, multi-walled carbon nanotubes, fullerenes, carbon nanoparticles, graphenes, two-dimensional carbon nanosheets, graphite platelets, other carbon nanostructured materials, metallic nanoparticles, semiconductor nanoparticles, quantum dots, and combinations of these materials.

13. The method of claim 10, wherein the cathode composite comprises at least one enzyme capable of reducing $O_2$, wherein such enzyme is selected from the group consisting of: laccase, bilirubin oxidase, ascorbate oxidase, tyrosinase, catechol oxidase, and combinations thereof.

14. The method of claim 10, wherein the electrochemical cell further comprises a redox mediator.

\* \* \* \* \*